(12) United States Patent
Simsek-Ege et al.

(10) Patent No.: US 11,862,668 B2
(45) Date of Patent: Jan. 2, 2024

(54) SINGLE-CRYSTAL TRANSISTORS FOR MEMORY DEVICES

(71) Applicant: Micron Technology, Inc., Boise, ID (US)

(72) Inventors: Fatma Arzum Simsek-Ege, Boise, ID (US); Masihhur R. Laskar, Meridian, ID (US); Nicholas R. Tapias, Boise, ID (US); Darwin Franseda Fan, Boise, ID (US); Manuj Nahar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/366,557

(22) Filed: Jul. 2, 2021

(65) Prior Publication Data
US 2023/0006034 A1 Jan. 5, 2023

(51) Int. Cl.
| | | |
|---|---|---|
| H01L 29/04 | (2006.01) | |
| H01L 29/10 | (2006.01) | |
| H10B 12/00 | (2023.01) | |
| H10B 53/30 | (2023.01) | |

(52) U.S. Cl.
CPC .......... *H01L 29/04* (2013.01); *H01L 29/1033* (2013.01); *H10B 12/00* (2023.02); *H10B 53/30* (2023.02)

(58) Field of Classification Search
CPC ... H01L 29/04; H01L 29/1033; H01L 27/108; H01L 27/11507
USPC ........................................................ 257/288
See application file for complete search history.

(56) References Cited

U.S. PATENT DOCUMENTS

| | | | | |
|---|---|---|---|---|
| 7,998,801 B2* | 8/2011 | Sasagawa | ........... | H01L 27/1288 257/E21.414 |
| 8,119,468 B2* | 2/2012 | Miyairi | ............... | H01L 27/1214 438/158 |
| 8,138,032 B2* | 3/2012 | Miyairi | ................... | H01L 29/04 257/E21.414 |

(Continued)

OTHER PUBLICATIONS

Jung et al., "A 500-MHZ DDR High-Performance 72-Mb 3-D SRAM Fabricated With Laser-Induced Epitaxial c-Si Growth Technology for a Stand-Alone and Embedded Memory Application," IEEE Transactions on Electron Devices, vol. 57, No. 2, Feb. 2010 (8 pages).

(Continued)

*Primary Examiner* — Sheikh Maruf
(74) *Attorney, Agent, or Firm* — Holland & Hart LLP

(57) ABSTRACT

Methods, systems, and devices for single-crystal transistors for memory devices are described. In some examples, a cavity may be formed through at least a portion of one or more dielectric materials, which may be deposited above a deck of memory cells. The cavity may include a taper, such as a taper toward a point, or a taper having an included angle that is within a range, or a taper from a cross-sectional area to some fraction of the cross-sectional area, among other examples. A semiconductor material may be deposited in the cavity and above the one or more dielectric materials, and formed in a single crystalline arrangement based on heating and cooling the deposited semiconductor material. One or more portions of a transistor, such as a channel portion of a transistor, may be formed at least in part by doping the single crystalline arrangement of the semiconductor material.

27 Claims, 11 Drawing Sheets

(56) References Cited

U.S. PATENT DOCUMENTS

| | | | | | |
|---|---|---|---|---|---|
| 8,216,951 | B2* | 7/2012 | Cheng | ................. | H03K 5/2427 438/797 |
| 8,237,151 | B2* | 8/2012 | Lochtefeld | .......... | H01L 31/1836 257/14 |
| 8,274,097 | B2* | 9/2012 | Cheng | ............... | H01L 29/66462 257/190 |
| 2009/0267068 | A1* | 10/2009 | Dairiki | ............. | H01L 29/66765 257/E29.291 |
| 2010/0096637 | A1* | 4/2010 | Yamazaki | ............... | H01L 29/04 257/66 |
| 2011/0049540 | A1* | 3/2011 | Wang | ...................... | H01L 33/44 257/E21.085 |
| 2011/0049568 | A1* | 3/2011 | Lochtefeld | ........ | H01L 21/02381 257/190 |
| 2011/0204364 | A1* | 8/2011 | Isa | ......................... | H01L 29/04 257/E21.414 |
| 2012/0205617 | A1* | 8/2012 | Pan | ......................... | H01L 33/32 257/13 |
| 2012/0241809 | A1* | 9/2012 | Pan | ........................ | H01L 33/24 257/E33.072 |
| 2014/0131722 | A1* | 5/2014 | Bayram | ............ | H01L 21/02458 438/478 |
| 2015/0108427 | A1* | 4/2015 | Brueck | ............. | H01L 21/02546 257/14 |
| 2015/0279945 | A1* | 10/2015 | Francis | .................. | H01L 29/32 438/105 |
| 2015/0371849 | A1* | 12/2015 | Holder | .................... | H01S 5/183 257/615 |
| 2017/0133362 | A1* | 5/2017 | Barlow | ............. | H01L 29/66462 |
| 2017/0194476 | A1* | 7/2017 | Brueck | ............. | H01L 21/02494 |
| 2018/0166326 | A1* | 6/2018 | Kumar | ................... | H01L 29/04 |

OTHER PUBLICATIONS

Hsieh et al., "Monolithic 3D BEOL FinFET switch arrays using location-controlled-grain technique in voltage regulator with better FOM than 2D regulators," IEDM 2019 (4 pages).

* cited by examiner

SINGLE-CRYSTAL TRANSISTORS FOR MEMORY DEVICES

FIELD OF TECHNOLOGY

The following relates generally to one or more systems for memory and more specifically to single-crystal transistors for memory devices.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3 dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
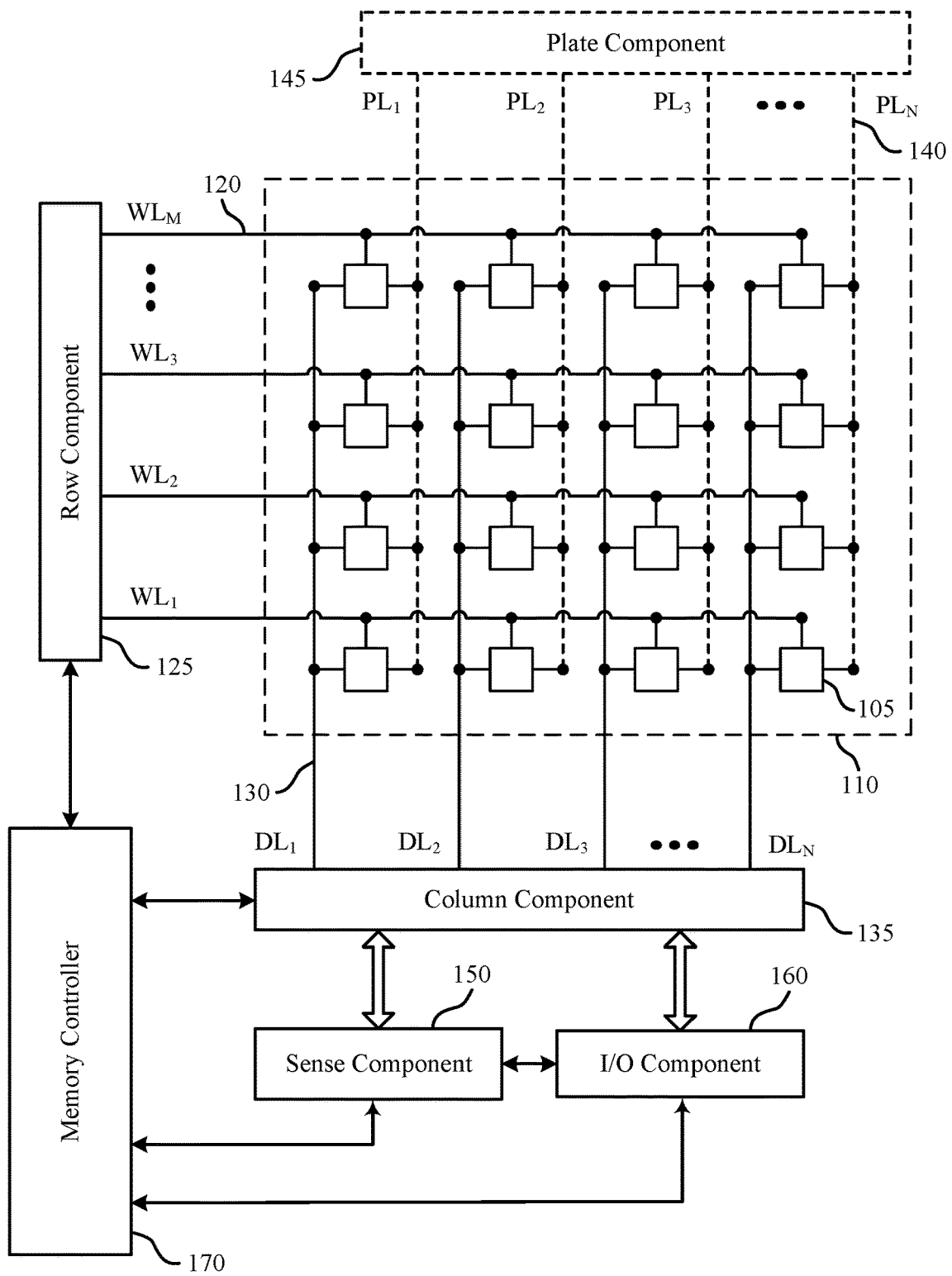
FIG. 1 illustrates an example of a memory device that supports single-crystal transistors for memory devices in accordance with examples as disclosed herein.

Memory devices may include various arrangements of memory arrays and supporting circuitry formed with or over a substrate. For example, a memory device may include one or more decks of memory arrays over a substrate, where a deck may refer to a plane or level of memory cells (e.g., of one or more memory arrays) above the substrate and, in some examples, generally parallel to the substrate. In some examples, circuitry that supports accessing or operating the memory arrays may be located below the memory arrays, which may refer to a location that is at least in part between the memory arrays and the substrate (e.g., in a vertical direction). For example, sensing circuitry, decoding circuitry, periphery circuitry, or other logic and circuitry may be located below the memory arrays but at least in part above the substrate and, in some examples, may include transistors that are formed at least in part by doping portions of the substrate (e.g., substrate-based transistors, transistors having channels formed from doped crystalline silicon or another semiconductor substrate). But as memory devices scale with and have a greater quantity of layers or decks of memory arrays above a substrate, the area of a substrate used for such substrate-based circuitry may increase, which may lead to additional limitations (e.g., related to the limited area of a substrate to support a growing quantity of decks and, by extension, a growing quantity and area for such substrate-based circuitry, related to routing challenges associated with locating some circuitry below a stack of decks but not above the stack of decks).

In accordance with examples as disclosed herein, a memory device may include one or more decks of memory cells and circuitry for accessing or operating the memory cells (e.g., semiconductor circuitry, transistor circuitry, complementary metal-oxide-semiconductor (CMOS) circuitry) with some of the circuitry being located above the one or more decks and some being located below the one or more decks. For example, the memory device may include lower substrate-based circuitry formed, in some examples, at least in part by doping portions of a lower semiconductor substrate (e.g., a base substrate, a silicon substrate, a crystalline semiconductor substrate, a chip or wafer) to form a first set of components, such as transistors. Above the lower substrate-based circuitry, the memory device may include one or more decks of memory cells and upper circuitry (e.g., transistors of the upper circuitry) formed, in some examples, at least in part by a semiconductor that is deposited over the one or more decks and formed in a crystalline arrangement based on a heating and a cooling of the deposited semiconductor. The semiconductor material may be deposited into tapered cavities that are etched into one or more dielectric or oxide materials, where the tapering may promote nucleation of the crystalline arrangement at a respective single location (e.g., at a bottom end of the cavity), rather than multiple nucleation locations that may result in a polycrystalline or multi-grain arrangement. In some examples, the described techniques may include depositing a seed material at the bottom of the cavities to further promote such cohesive single-grain nucleation. Channel portions of one or more transistors may be formed at least in part by doping regions of the single crystalline arrangement of the deposited semiconductor material. Accordingly, operation of the one or more decks of memory cells may be supported by lower circuitry, which may be formed at least in part by doped portions of a crystalline semiconductor substrate (e.g., a crystalline chip or wafer), and upper circuitry, which may be formed at least in part by doped portions of a semiconductor deposited over the one or more decks and formed with a crystalline arrangement in-situ.

Features of the disclosure are initially described in the context of a memory device and related circuitry as described with reference to FIGS. 1 and 2. Features of the disclosure are described in the context of a memory device layout and illustrative fabrication techniques with reference to FIGS. 3-7. These and other features of the disclosure are further illustrated by and described with reference to flowcharts that relate to single-crystal transistors for memory devices as described with reference to FIGS. 8 and 9.

FIG. 1 illustrates an example of a memory device 100 that supports single-crystal transistors for memory devices in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In some examples, a memory cell 105 may include or otherwise be associated with a configurable material, which may be referred to as a material memory element, a material storage element, a material portion, and others. The configurable material may have one or more variable and configurable characteristics or properties (e.g., material states) that may represent different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold characteristics, or other properties that are detectable or distinguishable during a read operation to identify a logic state written to or stored by the configurable material.

In some cases, a configurable material of a memory cell 105 may be associated with a threshold voltage. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with one logic state or another. Accordingly, the magnitude of current, or other characteristic (e.g., thresholding behavior, resistance breakdown behavior, snapback behavior) associated with the current that results from applying a read voltage to the memory cell 105, may be used to determine a logic state written to or stored by memory cell 105.

In the example of memory device 100, each row of memory cells 105 may be coupled with one or more word lines 120 (e.g., $WL_1$ through $WL_M$), and each column of memory cells 105 may be coupled with one or more digit lines 130 (e.g., $DL_1$ through $DL_N$). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A target or selected memory cell 105 may be a memory cell 105 located at the intersection of an energized or otherwise selected word line 120 and an energized or otherwise selected digit line 130.

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node or terminal of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130. A digit line 130 may then be accessed to read from or write to the respective memory cell 105.

In some examples, memory cells 105 may also be coupled with one or more plate lines 140 (e.g., $PL_1$ through $PL_N$). In some examples, each of the plate lines 140 may be independently addressable (e.g., supporting individual selection or biasing). In some examples, the plurality of plate lines 140 may represent or be otherwise functionally equivalent with a common plate, or other common node (e.g., a plate node common to each of the memory cells 105 in the memory array 110). When a memory cell 105 employs a capacitor for storing a logic state, a digit line 130 may provide access to a first terminal or a first plate of the capacitor, and a plate line 140 may provide access to a second terminal or a second plate of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer).

Access operations such as reading, writing, rewriting, and refreshing may be performed on a memory cell 105 by activating or selecting a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled using a row component 125 (e.g., a row decoder), a column component 135 (e.g., a column decoder), or a plate component 145 (e.g., a plate decoder), or a combination thereof. For example, a row component 125 may receive a row address from the memory controller 170 and activate the appropriate word line 120 based on the received row address. Similarly, a column component 135 may receive a column address from the memory controller 170 and activate the appropriate digit line 130. In some examples, such access operations may be accompanied by a plate component 145 biasing one or more of the plate lines 140 (e.g., biasing one of the plate lines 140, biasing some or all of the plate lines 140, biasing a common plate).

In some examples, the memory controller 170 may control operations (e.g., read operations, write operations, rewrite operations, refresh operations) of memory cells 105 using one or more components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output (I/O) component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of digit lines 130 connected to the sense component 150. For example, a sense component 150 may include a separate sensing circuit (e.g., a separate or duplicated sense amplifier, a separate or duplicated signal development component) for each of a set of digit lines 130 coupled with the sense component 150, such that a logic state may be separately detected for a respective memory cell 105 coupled with a respective one of the set of digit lines 130.

A memory cell 105 may be set, or written, by activating the relevant word line 120, digit line 130, or plate line 140 (e.g., via a memory controller 170). In other words, a logic state may be stored in a memory cell 105. A row component 125, a column component 135, or a plate component 145 may accept data, for example, via I/O component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude sufficient to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of a material memory architecture, a memory cell 105 may be written by applying a current, voltage, or other heating or biasing to a material memory element to configure the material according to a corresponding logic state.

In some examples, the memory device 100 may include multiple memory arrays 110 arranged in a stack of decks or levels relative to a substrate of the memory device 100 (e.g., a semiconductor substrate, a crystalline silicon substrate, a crystalline semiconductor substrate, a portion of a semiconductor chip or wafer). In some cases, circuitry that supports accessing or operating the multiple memory arrays 110 (e.g., semiconductor circuitry, transistor circuitry, CMOS circuitry) may be located below the memory arrays 110, which may refer to a location that is at least in part between the memory arrays 110 and the substrate. For example, one or more row components 125, one or more column components 135, one or more plate components 145, one or more sense components 150, or one or more I/O components 160, or any combination thereof, may be located below the memory arrays 110 and above the substrate and, in some examples, may include transistors that are formed at least in part by doping portions of the substrate (e.g., substrate-based transistors, transistors having channels formed from doped crystalline silicon or other semiconductor). When scaling the memory device 100 with a greater quantity of decks or levels of memory arrays 110, the area of a substrate used for supporting circuitry may increase, which may lead to scaling limitations (e.g., related to the limited area of a substrate to support circuitry for accessing a growing quantity of decks or levels of memory arrays 110 and, by extension, a growing quantity and area for such decoders or other supporting circuitry, related to routing challenges associated with locating certain circuitry below a stack of decks but not above the stack of decks), among other challenges.

In accordance with examples as disclosed herein, the memory device 100 may include one or more memory arrays 110, which may include memory arrays 110 arranged in a stack of decks formed above a substrate, and transistor circuitry formed both above and below the one or more memory arrays 110 to support accessing or operating the respective memory cells 105. For example, the memory device 100 may include lower substrate-based circuitry formed at least in part by doping portions of a semiconductor substrate (e.g., a base substrate, a silicon substrate, a crystalline semiconductor substrate, a chip or wafer) to form a first set of transistors. Above the lower substrate-based circuitry, the memory device 100 may include one or more decks of memory cells 105 and upper circuitry (e.g., transistors of the upper circuitry) formed at least in part by a semiconductor material that is deposited over the one or more decks and formed in a crystalline arrangement based on heating and cooling of the deposited semiconductor. The semiconductor material may be deposited into tapered cavities that are etched into one or more dielectric or oxide materials, where the tapering may promote nucleation of the crystalline arrangement at a respective single location (e.g., at a bottom end of the respective cavity), rather than multiple nucleation locations that may result in a polycrystalline or multi-grain arrangement. In some examples, the described techniques may include depositing a seed material at the bottom of the cavities to further promote such cohesive single-grain nucleation. Channel portions of a second set of transistors (e.g., of the upper circuitry) may be formed at least in part by doping regions of the single crystalline arrangement of the deposited semiconductor material. Thus, operation of the one or more decks of memory cells 105 may be supported by lower circuitry, which may be formed at least in part by doped portions of a crystalline semiconductor substrate (e.g., a crystalline chip or wafer), and upper circuitry, which may be formed at least in part by doped portions of a semiconductor deposited over the one or more decks and formed with a crystalline arrangement in-situ.

A combination of lower substrate-based circuitry and upper circuitry using a semiconductor crystallized in-situ may support accessing or operating of the decks of memory cells 105 in accordance with various techniques. For example, circuitry associated with a row component 125, a column component 135, a plate component 145, or a sense component 150, among other components or circuitry, may be divided between or distributed among lower circuitry and upper circuitry, including various allocations of circuitry associated with operating certain decks of a stack of decks of memory arrays 110. In some examples, circuitry that is common to or shared by each deck of the stack (e.g., one or more portions of an I/O component 160, or a memory controller 170, among other components or circuitry) may be coupled with lower circuitry and upper circuitry and, in some examples, may be formed above the upper circuitry.

Implementing operating circuitry across regions of crystalline semiconductor both above and below one or more memory arrays 110 may increase an area available for such circuitry compared to memory devices that include a single level of substrate-based semiconductor circuitry. Such techniques may support the memory device 100 leveraging crystalline semiconductor materials for a greater quantity of components, or larger components, for circuitry such as sensing circuitry, decoding circuitry, or periphery circuitry, among other circuitry used for accessing or otherwise operating memory arrays 110 of the memory device 100. In some examples, implementing such circuitry in multiple levels of crystalline semiconductor may alleviate or mitigate area utilization challenges or routing challenges of a single substrate level, which may improve scaling in memory devices 100 by supporting a greater quantity of decks for a given footprint. Accordingly, utilizing multiple levels of crystalline semiconductor circuitry may enable a greater scaling of decks, or improved scaling of memory storage, among other advantages.

Figure 2:
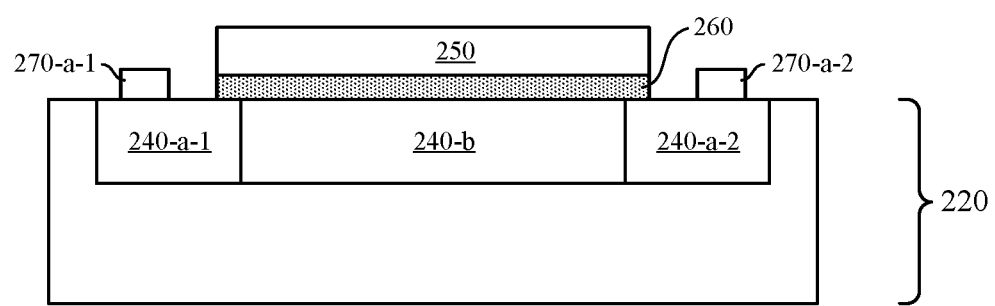
FIG. 2 illustrates an example of a transistor structure that supports single-crystal transistors for memory devices in accordance with examples as disclosed herein.
Figure 2:

FIG. 2 illustrates an example of a transistor structure 200 that supports single-crystal transistors for memory devices in accordance with examples as disclosed herein. The transistor structure 200 illustrates an example of a transistor that is formed at least in part by portions of a semiconductor material 220 (e.g., doped portions 240 of the semiconductor material 220), and may illustrate an arrangement of features for a transistor that is configured in a planar transistor arrangement. In some examples, the semiconductor material 220, or some portion thereof, may be formed with a crystalline arrangement, which may support favorable operational characteristics of the transistor structure 200, such as improved channel or charge carrier characteristics, among other characteristics. For example, the semiconductor material 220 may be formed such that at least adjacent doped portions 240 of the semiconductor material (e.g., doped portions 240-$a$-1, 240-$b$, and 240-$a$-2) are formed with a same or continuous atomic arrangement (e.g., a continuous crystalline arrangement), or are formed without grain boundaries or other discontinuities between different atomic arrangements.

For illustrative purposes, aspects of the transistor structure 200 may be described with reference to an x-direction, a y-direction, and a z-direction (e.g., a height direction) of a coordinate system 210. In some examples, the z-direction may be illustrative of a direction perpendicular to a surface of a substrate (e.g., a surface in an xy-plane, a surface upon or over which other materials may be deposited, a surface of a semiconductor chip or wafer), and each of the structures, illustrated by their respective cross section in an xz-plane, may extend for some distance (e.g., length) in the y-direction.

The transistor structure 200 illustrates an example of a transistor channel, electrically coupled between a terminal 270-$a$-1 and a terminal 270-$a$-2, that may include one or more doped portions 240 of the semiconductor material 220. In various examples, one of the terminals 270-$a$-1 or 270-$a$-2 may be referred to as a source terminal, and the other of the terminals 270-$a$-1 or 270-$a$-2 may be referred to as a drain terminal, where such a designation may be based on a configuration or relative biasing of a circuit that includes the transistor structure 200. The channel (e.g., the channel portion) of the transistor may include or refer to one or more portions of the transistor structure 200 that are operable to open or close a conductive path (e.g., to modulate a conductivity, to form a channel, to open a channel, to close a channel) between a source and drain (e.g., between the terminal 270-$a$-1 and the terminal 270-$a$-2) based at least in part on a voltage of a gate (e.g., a gate terminal, a gate portion 250). In other words, a channel portion of a transistor structure may be configured to be activated, deactivated, made conductive, or made non-conductive, based at least in part on a voltage of a gate portion, such as gate portion 250. In some examples of transistor structure 200 (e.g., a planar transistor arrangement), the channel portion formed by one or more doped portions 240 of the semiconductor material 220 may support a conductive path in a generally horizontal or in-plane direction (e.g., along the x-direction, within an xy-plane, in a direction within or parallel to a surface of a substrate).

In some examples, the gate portion 250 may be physically separated from the channel portion (e.g., separated from the semiconductor material 220, separated from one or more of the doped portions 240) by a gate insulation portion 260 (e.g., a gate dielectric). Each of the terminals 270-a may be in contact with or otherwise coupled with (e.g., electrically, physically) a respective doped portion 240-a, and each of the terminals 270-a and the gate portion 250 may be formed from an electrically conductive material such as a metal or metal alloy, or a polycrystalline semiconductor (e.g., polysilicon).

In some examples, the transistor structure 200 may be operable as an n-type or n-channel transistor, where applying a relatively positive voltage to the gate portion 250 that is above a threshold voltage (e.g., an applied voltage having a positive magnitude, relative to a source terminal, that is greater than a threshold voltage) activates the channel portion or otherwise enables a conductive path between the terminals 270-a-1 and 270-a-2 (e.g., along a direction generally aligned with the x-direction within the semiconductor material 220). In such examples, the doped portions 240-a may refer to portions having n-type doping or n-type semiconductor, and doped portion 240-b may refer to portions having p-type doping or p-type semiconductor (e.g., a channel portion having an NPN configuration along the x-direction or channel direction).

In some examples, the transistor structure 200 may be operable as a p-type or p-channel transistor, where applying a relatively negative voltage to the gate portion 250 that is above a threshold voltage (e.g., an applied voltage having a negative magnitude, relative to a source terminal, that is greater than a threshold voltage) activates the channel portion or otherwise enables a conductive path between the terminals 270-a-1 and 270-a-2. In such examples, the doped portions 240-a may refer to portions having p-type doping or p-type semiconductor, and doped portion 240-b may refer to portions having n-type doping or n-type semiconductor (e.g., a channel portion having a PNP configuration along the x-direction or channel direction).

In some examples, circuitry operable to support access operations on memory cells 105 (e.g., a row component 125, a column component 135, a plate component 145, a sense component 150, a memory controller 170, or various combinations thereof) may be formed at least in part by respective sets of transistors each having the arrangement of the transistor structure 200, where each of the transistors may have a channel portion formed by respective doped portions 240 of the semiconductor material 220. Some examples of such an arrangement may be implemented in a CMOS configuration, which may refer to various examples of a complementary and symmetrical pair of a p-type transistor and an n-type transistor (e.g., for logic functions). In some examples, such transistors may leverage a crystalline arrangement of the semiconductor material 220 (e.g., a single crystalline arrangement) for various performance characteristics or manufacturing characteristics of such a material or an arrangement. For example, at least the doped portions 240 of a given transistor (e.g., doped portions 240-a-1, 240-b, and 240-a-2) may be collectively formed from a single crystal grain or other continuous atomic arrangement of the semiconductor material 220 (e.g., with relatively few or no grain boundaries or other discontinuities within at least the adjacent, contacting, or otherwise cooperative doped portions 240). However, in some examples, such structures or arrangements of transistors may be limited by an available area of a crystalline substrate (e.g., a crystalline structure of a chip or wafer underneath a memory array 110 or stack of levels or decks of memory arrays 110).

In accordance with examples as disclosed herein, a memory device 100 may include upper circuitry (e.g., transistors of the upper circuitry) formed at least in part by a semiconductor material 220 that is deposited over one or more decks of memory cells 105 and formed in a crystalline arrangement based on heating and cooling of the deposited semiconductor material 220. The semiconductor material 220 may be deposited at least in part into tapered cavities that are etched into one or more dielectric or oxide materials, where the tapering may promote nucleation of the crystalline arrangement at a respective single location (e.g., at a bottom end of the respective cavity), rather than multiple nucleation locations that may result in a polycrystalline or multi-grain arrangement. The doped portions 240 of the upper circuitry transistors may be formed at least in part by doping regions of the single crystalline arrangement (e.g., single crystal grain or other continuous atomic arrangement of the semiconductor material) of the deposited semiconductor material 220. In some examples, such techniques may be leveraged for operating the one or more decks of memory cells 105 using a combination of lower circuitry, which may be formed at least in part by doped portions of a crystalline semiconductor substrate (e.g., a crystalline chip or wafer), and upper circuitry, which may be formed at least in part by doped portions of a semiconductor deposited over the one or more decks and formed with a crystalline arrangement in-situ.

Figure 3:
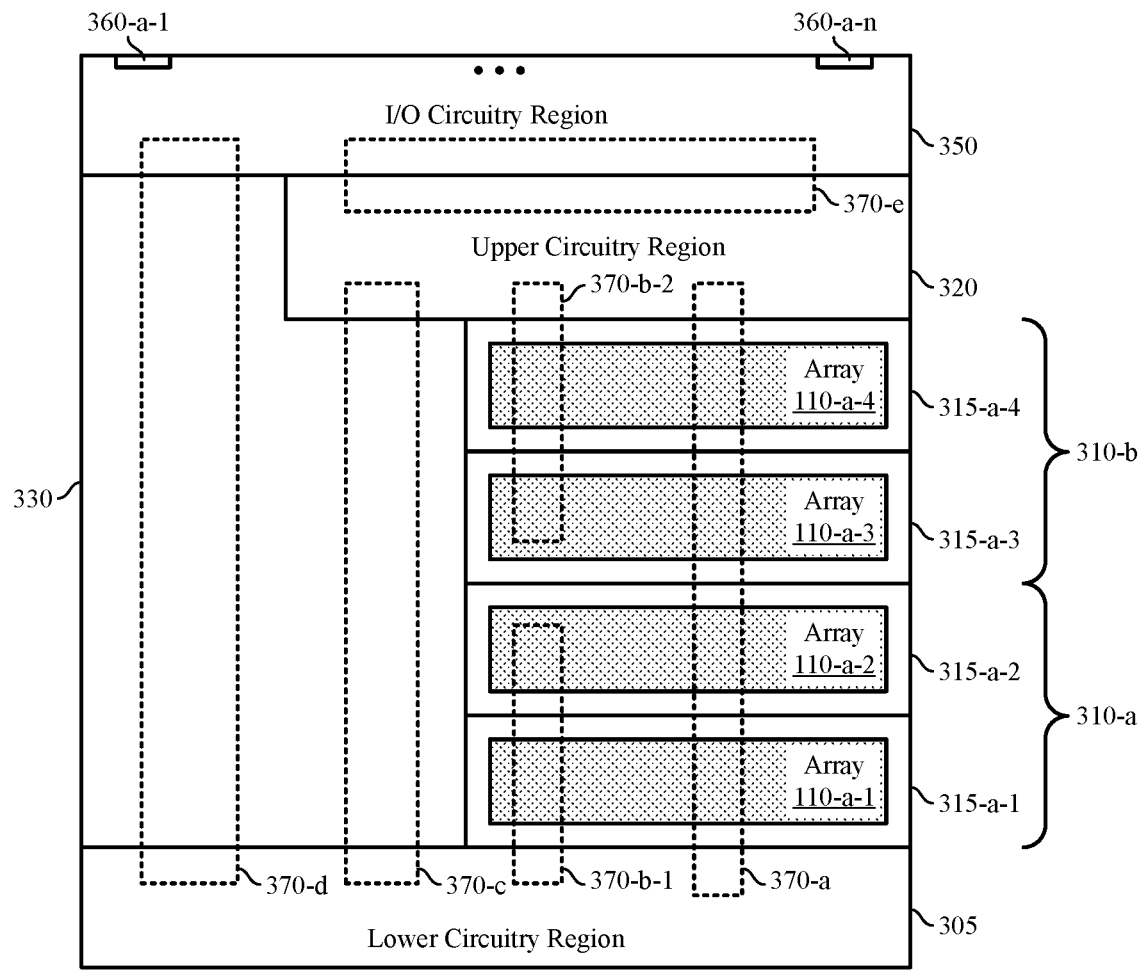
FIG. 3 illustrates a layout of a memory device that supports single-crystal transistors for memory devices in accordance with examples as disclosed herein.
Figure 3:

FIG. 3 illustrates an example of a memory device 300 that supports single-crystal transistors for memory devices in accordance with examples as disclosed herein. The memory device 300 may be an example of a memory device 100 described with reference to FIG. 1, and may include multiple levels of semiconductor circuitry (e.g., transistor circuitry, CMOS circuitry) for accessing and operating multiple decks or levels of memory arrays 110-a. For illustrative purposes, aspects of the memory device 300 may be described with reference to an x-direction, a y-direction, and a z-direction of a coordinate system 301. In some examples, the z-direction may be illustrative of a direction perpendicular to a surface of a substrate (e.g., a surface in an xy-plane, a surface upon or over which other materials may be deposited), and each of the related regions, illustrated by their respective cross-section in an xz-plane, may extend for some distance along the y-direction. In some examples, the x-direction may be aligned with or referred to as a row direction (e.g., along a row of memory cells 105), and the y-direction may be aligned with or referred to as a column direction (e.g., along a column of memory cells 105), or vice versa.

Each of the illustrative regions of the memory device 300 may be associated with a region of components or circuitry that may be formed using various techniques. In some examples, functional components such as transistors in various configurations or arrangements within the illustrative regions may be interconnected by routing conductors (e.g., metal conductors) of the respective regions, which may include various arrangements of through-silicon vias (TSVs) or socket conductors that may be aligned along the z-direction, or various arrangements of in-plane conductors that may be aligned in one or more directions parallel to an xy-plane, or combinations thereof. Such interconnection may be associated with signal routing, or power or voltage distribution, among other functions.

The memory device 300 may include a lower circuitry region 305, which may include first (e.g., lower) set of transistors (e.g., first transistor circuitry, first CMOS circuitry). In some cases, the first set of transistors may be substrate-based transistors (e.g., formed by doping portions of a semiconductor substrate, a crystalline silicon substrate, a crystalline semiconductor substrate, a portion of a semiconductor wafer). A substrate of the lower circuitry region 305 may be a base or initial substrate of the memory device 300, upon which other components or circuitry are formed, and over which another upper circuitry region 320 may be added. In some examples, transistors of the lower circuitry region 305 may include transistors formed or configured in accordance with the transistor structure 200, including such transistors in a CMOS arrangement.

Above the lower circuitry region 305, the memory device 300 may include a stack of decks 315-a, where each deck 315-a may be located at a different position along the z-direction. The memory device 300 illustrates an example that includes four decks 315-a (e.g., decks 315-a-1 through 315-a-4), but a memory device 100 in accordance with examples as disclosed herein may include any quantity of one or more decks 315. Each deck 315-a may include a respective memory array 110-a, which may include a plurality of memory cells 105 that are distributed in an xy-plane. In some examples, memory cells 105 of a memory array 110-a may be arranged in rows that are aligned along the x-direction and columns that are aligned along the y-direction. Each of the memory arrays 110-a may include respective word lines 120 (e.g., along the x-direction), digit lines 130 (e.g., along the y-direction), and plate lines 140 (e.g., where applicable) for accessing the respective memory cells 105, among other circuitry.

The memory arrays 110-a of the memory device 300 may include memory cells 105 in accordance with various memory architectures. In some examples, memory cells 105 of a memory array 110-a may each include a respective storage component (e.g., a capacitor) and a respective cell selection component (e.g., a cell selection transistor). In some examples (e.g., in an FeRAM application), capacitors of the memory cells 105 may be ferroelectric capacitors operable to store a charge or polarization corresponding to a logic state. A ferroelectric material used in a ferroelectric capacitor may be characterized by an electric polarization where the material maintains a non-zero electric charge in the absence of an electric field. In some examples, memory cells 105 of the memory arrays 110-a may include storage elements of different memory architectures, such as linear capacitors (e.g., in a DRAM application), transistors (e.g., in a NAND application, in an SRAM application), or material memory elements (e.g., in a RRAM application or a PCM application, which may include chalcogenide storage elements, resistive storage elements, thresholding storage elements), among other types of storage elements.

In some examples, the decks 315-a may include various transistors, such as cell selection transistors of or associated with the memory cells 105 of the respective memory arrays 110-a, among other examples. Transistors of the decks 315-a may be formed in accordance with various thin film manufacturing techniques, including deposition of polycrystalline semiconductor materials (e.g., polysilicon) over the lower circuitry region 305. In some examples, transistors of the decks 315-a may include vertical transistors, which may support a respective channel formed at least in part along the z-direction.

Above the decks 315-a, the memory device 300 may include an upper circuitry region 320, which may include second (e.g., upper) set of transistors (e.g., second transistor circuitry, second CMOS circuitry). The second set of transistors may be formed at least in part by a semiconductor material 220 of the upper circuitry region 320 that is deposited over the decks 315-a, and that has been heated and cooled to form one or more portions of the semiconductor material 220 in a crystalline arrangement (e.g., a single crystal grain or other continuous atomic arrangement of the semiconductor material 220 that supports the formation of at least one transistor). In some examples, the semiconductor material 220 may be deposited at least partially in tapered cavities, etched or otherwise formed in a dielectric portion deposited over the decks 315-a (e.g., in the upper circuitry region 320), where the tapering may facilitate nucleation of the single crystalline arrangement. The second set of transistors of the upper circuitry region 320 may be formed by doping portions of the semiconductor material 220 in the single crystalline arrangement. In some examples, transistors of the upper circuitry region 320 may include transistors formed or configured in accordance with the transistor structure 200, including such transistors in a CMOS arrangement.

Above the upper circuitry region 320, the memory device 300 may include an I/O circuitry region 350, which may include circuitry to route signals for communication with a host device coupled to the memory device 300, among other signals. For example, the I/O circuitry region 350 may include one or more pads 360-a (e.g., pads 360-a-1 through 360-a-n, conductive interfaces) that support various coupling or electronic communication between the memory device 300 and a host device (e.g., for signaling associated with read or write commands, among other signaling). In some examples, the pads 360-a may be associated with signaling of one or more channels (e.g., data channels, control channels) for communicating information, commands, or diagnostic information between the memory device 300 and a host device. In some examples, the pads 360-a may be configured for supplying power or voltages to various components of the memory device 300, among other purposes. The I/O circuitry region 350 may include various circuitry for communicating signals with both the upper circuitry region 320 and the lower circuitry region 305. In some examples, the memory device 300 may include a backend interconnect region 330 above the lower circuitry region 305, which may support interconnection between the lower circuitry region 305 and the upper circuitry region 320, or interconnection between the lower circuitry region 305 and the I/O circuitry region 350, or both.

The memory device 300 may use circuitry of the lower circuitry region 305 and the upper circuitry region 320 to access and operate memory cells 105 of the memory arrays 110-a. In some examples, circuitry of the lower circuitry region 305, or circuitry of the upper circuitry region 320, or both may include circuitry for performing sense operations, circuitry for performing access operations, circuitry for performing decoding operations, or circuitry for performing I/O operations, or a combination thereof, among other operations. For example, circuitry of the lower circuitry region 305, or circuitry of the upper circuitry region 320, or both may include one or more portions of a row component 125, a column component 135, or a plate component 145, such as decoders, buffers, multiplexers, or drivers (e.g., word line drivers, sub-word line drivers, digit line drivers, sub-digit line drivers, plate line drivers, sub-plate line drivers, among other drivers), among other circuitry configured to address, decode, or bias access lines of one or more memory arrays 110-a of the memory device 300. Additionally or alternatively, circuitry of the lower circuitry region 305, or circuitry of the upper circuitry region 320, or both may include one or more portions of a sense component 150, such as one or more sense amplifiers, or one or more signal development components, among other circuitry for sensing or writing to memory cells 105 of the memory device 300.

In some examples, subsets of transistors of the lower circuitry region 305, or of the upper circuitry region 320, or both may be dedicated or allocated for a given purpose (e.g., function, operation). For example, sensing circuitry may include a subset of transistors that are configured to support sense operations, access circuitry (e.g., row access circuitry, column access circuitry, plate access circuitry) may include a subset of transistors that are configured to support activating or biasing access lines, decoding circuitry may include a subset of transistors that are configured to support decoding operations, I/O circuitry may include a subset of transistors that are configured to support I/O operations, and so on. That is, transistors of the lower circuitry region 305, or of the upper circuitry region 320, or both may be divided into various subsets of transistors that each support different operations and functions of the memory device 300.

In some examples, one or more portions of the lower circuitry region 305 may be dedicated or allocated to supporting operation of some memory arrays 110-*a* of the memory device 300 but not others, and one or more portions of the upper circuitry region 320 may be dedicated or allocated to supporting operation of some memory arrays 110-*a* of the memory device 300 but not others. For example, in an example with multiple decks 315-*a*, the decks 315-*a* may be divided into a first set 310-*a* (e.g., a lower set, including decks 315-*a*-1 and 315-*a*-2) and a second set 310-*b* (e.g., an upper set, including decks 315-*a*-3 and 315-*a*-4). In some examples, a division of the decks 315 into sets 310 may refer to how decks 315 are coupled to substrate-based circuitry of the memory device 300. For example, a set 310-*a* may refer to any quantity of decks 315-*a* that are coupled at least in part to lower substrate-based circuitry and a set 310-*b* may refer to any quantity of decks 315-*a* that are coupled at least in part to upper substrate-based circuitry. Although the example of memory device 300 illustrates two sets 310 having a same quantity of decks 315-*a*, in some examples, a memory device 100 may include sets 310 having different quantities of decks 315.

The components and circuitry of the memory device 300 may be coupled through various interconnection regions 370. Each of the interconnection regions 370 may illustrate portions of the memory device 300 that support electrical coupling or interconnection along at least the z-direction between components or circuitry of the illustrated regions. For example, each interconnection region 370 may include various arrangements of TSVs or socket conductors that may be aligned along the z-direction. In some examples, the interconnection regions 370 may include various arrangements of in-plane conductors (e.g., in-plane routing between or among interconnections along the z-direction) that may be aligned in one or more directions parallel to an xy-plane, or combinations thereof.

The interconnection region 370-*a* may illustrate an example of a coupling between each of the memory arrays 110-*a* and the lower circuitry region 305 and the upper circuitry region 320. In some examples, the interconnection region 370-*a* may be an example of a word line socket region which may be used to select and activate one or more word lines of each of the decks 315-*a*, 315-*b*, 315-*c*, and 315-*d*. For example, the interconnection region 370-*a* may include interconnects that couple word lines of decks 315-*a*-1 through 315-*a*-4 to decoders (e.g., row components 125) or word line drivers (e.g., sub-word line drivers) included in the lower circuitry region 305, in the upper circuitry region 320, or both. Although the interconnection region 370-*a* illustrates coupling between the memory arrays 110-*a* and both the lower circuitry region 305 and the upper circuitry region 320, in some examples, an interconnection region 370-*a* may be implemented for coupling between the memory arrays 110-*a* and one of the lower circuitry region 305 or the upper circuitry region 320, but not both (e.g., in examples where CMOS or other circuitry of a row component 125, common to all of the memory arrays 110-*a*, is located in one of the lower circuitry region 305 or the upper circuitry region 320).

The interconnection regions 370-*b* may illustrate examples of a coupling between memory arrays 110-*a* of a set 310 and one of the lower circuitry region 305 or the upper circuitry region 320. In some examples, interconnection regions 370-*b* may be examples of a digit line socket region, which may be used to select and activate one or more digit lines of the decks 315-*a*. For example, the memory device 300 may include an interconnection region 370-*b*-1 that couples digit lines of decks 315-*a*-1 and 315-*a*-2 of the set 310-*a* to decoders (e.g., column components 135), digit line drivers (sub-digit line drivers), sense amplifiers, or a combination thereof, of the lower circuitry region 305. In some examples, the memory device 300 may include an interconnection region 370-*b*-2 that includes interconnects that couple digit lines of decks 315-*a*-3 and 315-*a*-4 of the set 310-*b* to such circuitry of the upper circuitry region 320.

The interconnection region 370-*c* may illustrate an example of a coupling between the lower circuitry region 305 and the upper circuitry region 320. For example, the upper circuitry region 320 may include pad logic or other CMOS circuitry associated with functionality for all of decks 315-*a*-1 through 315-*a*-4, which may be coupled with decks 315-*a*-1 and 315-*a*-2 via the interconnection region 370-*c* and via the lower circuitry region 305. Locating such pad logic or other shared CMOS circuitry in the upper circuitry region 320 may provide favorable proximity to components or circuitry of the I/O circuitry region 350, or may reduce area utilization of a substrate (e.g., a chip or wafer associated with the lower circuitry region 305) for favorable scaling or routing flexibility, or both, among other advantages.

The interconnection region 370-*d* may illustrate an example of a coupling between the lower circuitry region 305 and the I/O circuitry region 350, and the interconnection region 370-*e* may illustrate an example of an interconnection between the upper circuitry region 320 and the I/O circuitry region 350.

By including both the lower circuitry region 305 and the upper circuitry region 320, the memory device 300 may support a distribution of transistor circuitry for accessing and operating a stack or multiple decks 315-*a* between multiple regions or levels of crystalline semiconductor, which may reduce the area or footprint of a substrate (e.g., a chip or wafer) that is occupied by such circuitry. A distribution of circuitry between such regions may enable greater scaling of the memory device 300 (e.g., using a greater quantity of decks 315-*a*) within a given area or footprint. Moreover, in some examples, pad logic or other circuitry associated with both the lower set 310-*a* and the upper set 310-*b* may be included in the upper circuitry region 320 (e.g., rather than being distributed between the upper circuitry region 320 and the lower circuitry region 305, or included entirely in the lower circuitry region 305), which may support allocating more of a lower substrate for other purposes, such as interconnect circuitry that supports an increased quantity of decks 315-a.

Figure 4A:
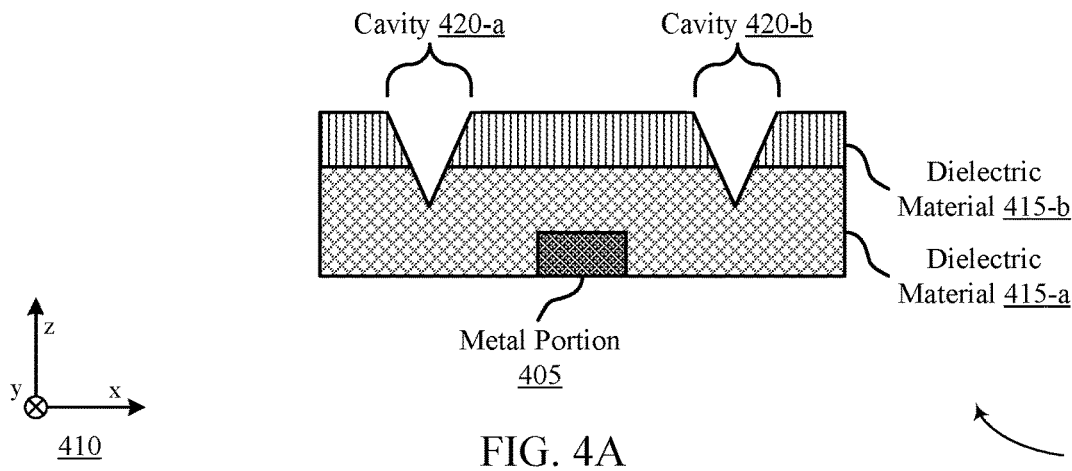
FIGS. 4A through 4C illustrate examples of operations that support forming single-crystal transistors for memory devices in accordance with examples as disclosed herein.
Figure 4B:
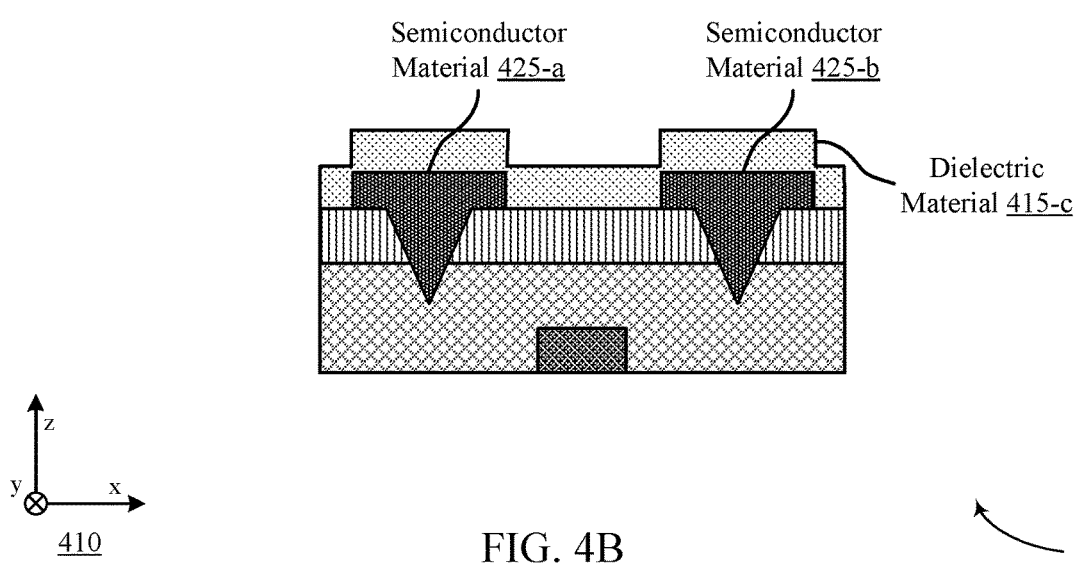
Figure 4C:
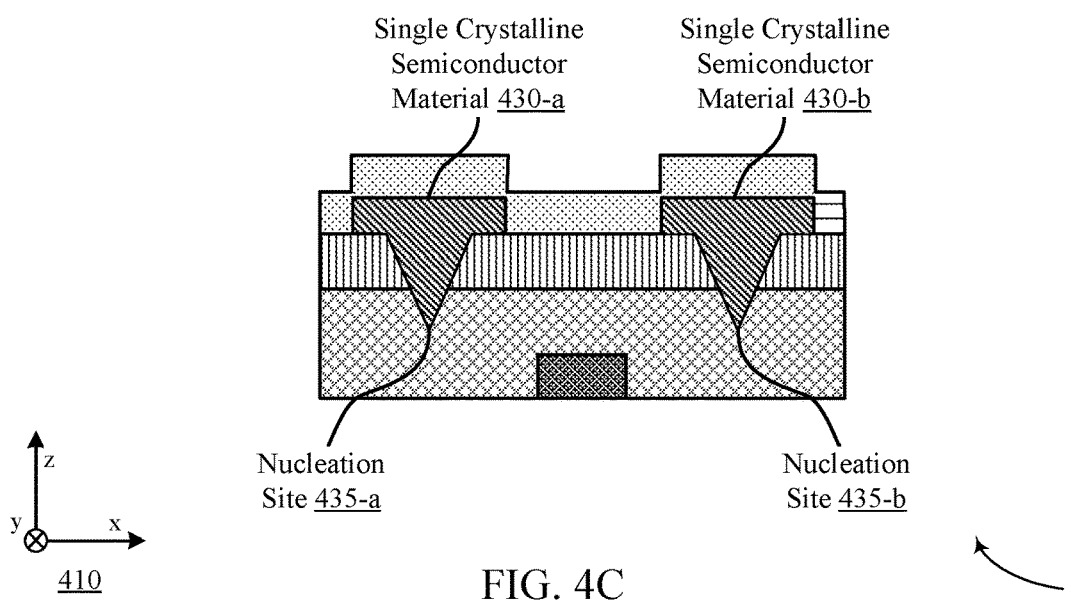

FIGS. 4A through 4C illustrate examples of operations that support forming single-crystal transistors for memory devices in accordance with examples as disclosed herein. For example, FIGS. 4A through 4C may illustrate aspect of a sequence of operations for fabricating a material layout 400, which may be a portion of a memory device (e.g., a memory device 100, a memory device 300, a memory die), such as a portion of an upper circuitry region 320 described with reference to FIG. 3. However, the described techniques may be implemented to support fabricating other portions of a memory device, or other types of semiconductor apparatuses (e.g., semiconductor dies) that include forming crystalline atomic arrangements of a semiconductor material that is deposited over a substrate. Each of the figures may be described with reference to an x-direction, a y-direction, and a z-direction of a coordinate system 410. Operations illustrated in and described with reference to FIGS. 4A through 4C may be performed by a manufacturing system, such as a semiconductor fabrication system configured to perform additive operations such as deposition or bonding, subtractive operations such as etching, trenching, planarizing, or polishing, and supporting operations such as masking, photolithography, or aligning, among other operations that support the described techniques.

FIG. 4A illustrates a first portion of the material layout 400 after a first set of manufacturing operations, including aspects of a dielectric material 415-a and a dielectric material 415-b. In some examples, the dielectric material 415-a and the dielectric material 415-b may be deposited over one or more arrays of memory cells 105 (e.g., in an upper circuitry region 320). In some examples, the dielectric material 415-a may include an oxide material (e.g., where the dielectric material 415-a is an oxide, such as an oxide of silicon) and the dielectric material 415-b may include a nitride material (e.g., where the dielectric material 415-b is a nitride, such as a nitride of silicon). Although two dielectric materials 415 are illustrated, a material layout in accordance with the described techniques may include any quantity of one or more layers of dielectric material 415, which may include multiple layers of a same material, or layers of two or more different materials, or both.

The dielectric materials 415 may be associated with a thermal conductivity, which may be leveraged to manage heat transfer (e.g., heat transfer rate, heat transfer direction) through the material layout 400 to support preferential nucleation of a crystalline semiconductor arrangement. In the example of material layout 400, the dielectric material 415-a may be associated with a first thermal conductivity and the dielectric material 415-b may be associated with a second thermal conductivity. In some examples, the second thermal conductivity may be less than the first thermal conductivity, which may encourage heat transfer along a downward direction through the material layout 400.

In some examples, one or more dielectric materials 415 may be deposited over or around a metal portion 405 (e.g., of an upper circuitry region 320, of a deck 315). The metal portion 405 may be an access line of a deck 315 or an upper circuitry region 320, or a portion of an interconnection region 370, such as a coupling between an upper circuitry region 320 and a deck 315. In some examples, a metal portion 405 also may be leveraged to manage heat transfer (e.g., heat transfer rate, heat transfer direction) through the material layout 400 to support preferential nucleation of a crystalline semiconductor arrangement. In some examples, such a configuration may include not aligning the metal portion 405 directly underneath the cavities 420 (e.g., along the z-direction), which may support a relatively slower heat transfer from a semiconductor material that is deposited in the cavities 420. The dielectric material 415-a may be deposited over (e.g., in contact with) the metal portion 405, and the dielectric material 415-b may be deposited over the dielectric material 415-a. In some examples, a metal portion 405 may be omitted, or may be otherwise negligible in the processing in the material layout 400.

Each of the dielectric materials 415 may be associated with a respective thickness (e.g., along the z-direction), which may be selected or defined to support characteristics of the material layout 400. In some examples, the dielectric material 415-a (e.g., an oxide) may have a thickness between 100 and 500 nanometers (e.g., approximately 300 nanometers), and the dielectric material 415-b (e.g., a nitride) may have a thickness between 20 and 100 nanometers (e.g., approximately 60 nanometers). In examples that include a single dielectric material 415 (e.g., a single layer), a thickness of the single dielectric material 415 may be similar to a total thickness of the dielectric materials 415-a and 415-b, such as having a thickness between 100 and 600 nanometers (e.g., 360 nanometers).

As illustrated in the material layout 400, cavities 420 may be etched or otherwise formed in the one or more dielectric materials 415. Each of the cavities 420 may extend through at least a portion of the dielectric materials 415 (e.g., corresponding to a depth of the cavities along the z-direction). In the example of material layout 400, the cavities 420 may extend through the entire depth of the dielectric material 415-b and a portion of the dielectric material 415-a. In examples where a material layout includes a single dielectric material 415, cavities 420 may extend a similar depth, but may not extend through an entire thickness of the single dielectric material 415. In some examples, the depth of the cavities 420 may be between 100 and 300 nanometers. Each of the cavities 420 may be separated from adjacent cavities by a separation distance (e.g., along the x-direction, along the y-direction, in an xy-plane), which may refer to a centerline distance (e.g., between centerlines along the z-direction), or a minimum separation distance (e.g., in an xy-plane, at a top surface of the dielectric material 415-b. For example, the cavity 420-a may be separated from the cavity 420-b by a distance between 0.5 and 1.5 micrometers (e.g., 1 micrometer).

Each of the cavities 420 may be tapered along the z-direction, which may refer to various examples of a reduction in cross-sectional dimension (e.g., width along the x-direction, along the y-direction, or both) or area (e.g., in an xy-plane) of a cavity 420 from an opening of the cavity 420 to a bottom of the cavity 420 (e.g., along a negative z-direction). In some examples, such a configuration may include or be referred to as having a taper toward a point, such as a taper having a conical or pyramidal shape, or a partial conical or pyramidal shape (e.g., a frustum). Although a cavity 420 may include a taper toward a point, a bottom of the cavity 420 may not reach an explicit point or singularity, and may have a degree of rounding or otherwise non-zero cross sectional area at the bottom of the cavity 420. In some examples, each cavity 420 may have a first cross-sectional area (e.g., at the top surface of the dielectric material 415-b, at an opening of the cavity 420) with a width (e.g., along the x-direction, along the y-direction) or a diameter (e.g., in an xy-plane) between 20 and 200 nanometers. In some examples, each cavity 420 may have a second cross-section area (e.g., opposite an opening of the cavity 420, at or near a bottom of cavity 420) with a width or diameter that is less than or equal to a threshold dimension, such as being less than or equal to 10 nanometers, or less than or equal to 7 nanometers, among other threshold dimensions.

In some examples, a taper of a cavity 420 may be expressed as a ratio of cross-sectional areas or widths, including such ratios between a first cross-sectional area (e.g., at a top surface of the dielectric material 415-b) and a second cross-sectional area that is smaller than the first cross-sectional area (e.g., opposite the first cross-sectional area, at or near a bottom of the cavity 420). For example, a taper of a cavity 420 may be associated with a lower cross-section having an area or width that is less than 50% of the corresponding dimension of an upper cross-section, or less than 30% of the corresponding dimension of an upper cross-section. In some examples, a taper of a cavity 420 may be expressed as an angle relative to the z-axis, or an included angle of the cavity 420, such as a cavity 420 having an included angle between 25 degrees and 75 degrees (e.g., between 35 and 55 degrees).

In some examples, the cavities 420 may taper uniformly, or uniformly within a threshold (e.g., related to a surface roughness or irregularity), from an opening of the cavity 420. For example, the cavities 420 may be described as being at least partially v-shaped, conical, or pyramidal. In some examples, the cavities 420 may extend through at least a portion of one or more dielectric materials 415 without tapering, and then taper along the z-direction from the first cross-section to the second, smaller, cross-section. For example, a top section of a cavity 420 may be substantially cylindrical and a bottom portion of the cavity 420 may be substantially conical (e.g., for a zero or near-zero second cross-section) or partially conical (e.g., as a frustum, for a cross section with a non-negligible width dimension).

FIG. 4B illustrates a second portion of the material layout 400 after a second set of manufacturing operations, including aspects of a semiconductor material 425 and an optional dielectric material 415-c that may be deposited over the dielectric materials 415-a and 415-b.

The semiconductor material 425 may be deposited in the cavities 420, and above the dielectric material 415-b (e.g., with a thickness dimension above a surface of the dielectric material 415-b along the z-direction). For example, a thickness of the semiconductor materials 425 may be between 50 and 100 nanometers above the top surface of the dielectric material 415-b (e.g., between 60 and 80 nanometers). In some examples, the semiconductor materials 425 may be formed by depositing a semiconductor layer (e.g., comprising the semiconductor materials 425) in contact with the top surface of the dielectric material 415-b. In such examples, the semiconductor materials 425-a and 425-b may be formed by etching portions of the semiconductor layer to expose a top surface of the dielectric material 415-b. In another example, the semiconductor materials 425 may be formed by depositing a masking material in a pattern and depositing the semiconductor materials 425 in openings of the masking. In some examples, the masking material may be removed to expose the top surface of the dielectric material 415-b between the semiconductor materials 425. The semiconductor materials 425 may be deposited without a particular atomic arrangement, such as depositing the semiconductor materials 425 with an amorphous or polycrystalline arrangement. In some examples, after forming the semiconductor materials 425, the dielectric material 415-c may optionally be deposited over the semiconductor materials 425 and the dielectric material 415-b. In some cases, the dielectric material 415-c may include a tetraethoxysilane material.

FIG. 4C illustrates a third portion of the material layout 400 after a third set of manufacturing operations, including aspects of converting the deposited semiconductor materials 425 into single crystalline semiconductor materials 430. In some examples, such a conversion may be supported by a heating and cooling (e.g., annealing) of each of the deposited semiconductor materials 425 to form the semiconductor with respective crystalline (e.g., single crystal) arrangements.

In some cases, heating of the material layout 400 may be provided by applying a laser to the semiconductor materials 425 or the dielectric material 415-c (e.g., where applicable). In some examples, a laser may be applied with a single pulse (e.g., over a single duration). For example, a laser having a wavelength between 400 and 700 nanometers (e.g., 532 nanometers) may be applied for a duration that is between 5 and 100 nanoseconds. In some examples, a laser may be applied with multiple pulses. For example, a laser having a wavelength between 150 and 450 nanometers (e.g., between 250 and 350 nanometers) may be applied for a quantity of pulses each having a duration between 50 and 250 nanoseconds. In some examples, a duration for applying a laser to the semiconductor materials 425 may be between 10 nanoseconds and 1 microsecond.

According to these and other examples, applied heating may cause each of the semiconductor materials 425 to melt, and the molten semiconductor materials 425 may cool to form respective single crystalline semiconductor materials 430. During the cooling, the respective crystalline arrangements may nucleate at each of the nucleation sites 435, which may be located at the bottom of the tapered cavities 420. Such nucleation sites 435 may be configured or otherwise encouraged based at least in part on heat transfer through the material layout 400 (e.g., with heat flowing downward through the material layout 400, based at least in part on heating being applied at an upper portion of the semiconductor materials 425 and insulative properties of one or more dielectric materials 415), such that locations of the molten semiconductor materials 425 near nucleation sites 435 may be associated with a relatively lower temperature than other locations of the melted semiconductor materials 425. Accordingly, nucleation sites 435 may be relatively more-likely to be associated with an initiation of an ordering of an atomic arrangement, and such an atomic arrangement may grow along the positive z-direction (e.g., with a vertically upward crystallization growth through the cavities. Having a relatively small cross-section at the bottom of the cavities 420 (e.g., less than or equal to a threshold dimension, a taper towards a point) may increase a likelihood that nucleation begins at a single location, rather than having multiple nucleation sites in each cavity 420.

Growth of the single crystalline arrangement may continue to spread through the semiconductor materials 425, including a lateral growth (e.g., along the x-direction, along the y-direction) as a boundary between crystalline and molten portions extends beyond a top surface of the dielectric material 415-b. The growth of the crystalline arrangement may be supported by relatively slow cooling of the molten semiconductor material 425, which may include maintaining a chuck or other fixturing, or a chamber or other ambient environment, or both at a controlled temperature that may be relatively high, but lower than a temperature of the molten semiconductor materials 425 (e.g., supporting heat flux in a downward direction through the semiconductor materials 425). Each of the single crystalline semiconductor materials 430 may be used to form one or more transistors, such as transistors in accordance with the transistor structure 200, which may include various techniques of doping the single crystalline semiconductor materials 430. For example, each of the single crystalline semiconductor materials 430 may be an example of a respective semiconductor material 220, and may be doped to form one or more doped portions 240.

In examples of the material layout 400 that omit the dielectric material 415-c, the single crystalline semiconductor materials 430 may expand beyond an original volume of the respective semiconductor materials 425. In such examples, the single crystalline semiconductor materials 430 may be etched, polished, or planarized before doping operations to form one or more transistors. In examples of the material layout 400 that include the dielectric material 415-c, the dielectric material 415-c may be removed partially or entirely (e.g., using a chemical mechanical polishing (CMP) process) before doping operations to form one or more transistors.

FIGS. 5A through 5F illustrate examples of operations that support forming single-crystal transistors for memory devices in accordance with examples as disclosed herein. For example, FIGS. 5A through 4F may illustrate aspect of a sequence of operations for fabricating a material layout 500, which may be a portion of a memory device (e.g., a memory device 100, a memory device 300, a memory die), such as a portion of an upper circuitry region 320 described with reference to FIG. 3. However, the described techniques may be implemented to support fabricating other portions of a memory device, or other types of semiconductor dies that include forming crystalline atomic arrangements of a semiconductor material that is deposited over a substrate. Each of the figures may be described with reference to an x-direction, a y-direction, and a z-direction of a coordinate system 510. Operations illustrated in and described with reference to FIGS. 5A through 5F may be performed by a manufacturing system, such as a semiconductor fabrication system configured to perform additive operations such as deposition or bonding, subtractive operations such as etching, trenching, planarizing, or polishing, and supporting operations such as masking, photolithography, or aligning, among other operations that support the described techniques.

Figure 5A:
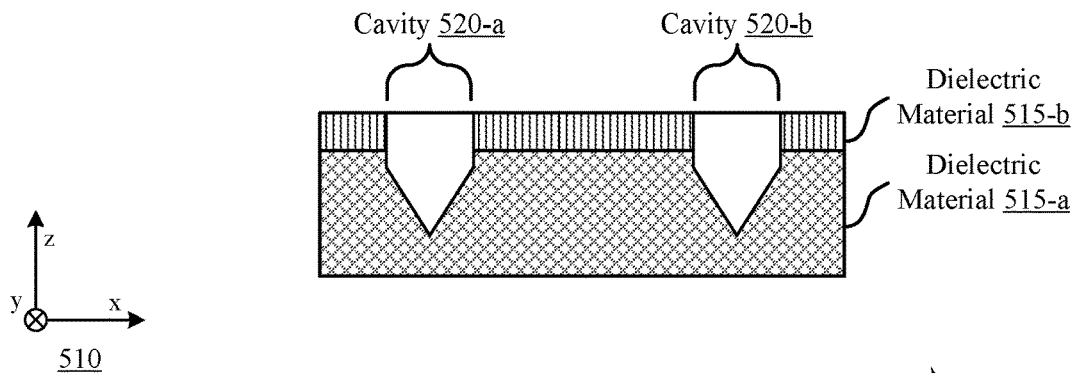
FIGS. 5A through 5F illustrate examples of operations that support forming single-crystal transistors for memory devices in accordance with examples as disclosed herein.

FIG. 5A illustrates a first portion of the material layout 500 after a first set of manufacturing operations, which may be similar to aspects of the first portion of the material layout 400 described with reference to FIG. 4A. For example, the first portion of the material layout 500 may include a dielectric material 515-a and a dielectric material 515-b, which may be deposited over one or more arrays of memory cells 105 (e.g., in an upper circuitry region 320) or in another portion of semiconductor die. In some examples, the dielectric material 515-a may include an oxide material (e.g., an oxide of silicon having a thickness between 300 and 500 nanometers) and the dielectric material 515-b may include a nitride material (e.g., a nitride of silicon having a thickness between 20 and 60 nanometers). Although two dielectric materials 515 are illustrated, a material layout in accordance with the described techniques may include any quantity of one or more layers of dielectric material 515, which may include multiple layers of a same material, or layers of two or more different materials, or both.

As illustrated in the material layout 500, cavities 520 may be etched or otherwise formed in the one or more dielectric materials 515, and may have one or more characteristics similar to those described with reference to the cavities 420 of the material layout 400. For example, each of the cavities 520 may include a taper along the z-direction (e.g., toward a point), which may refer to various examples of a reduction in cross-sectional dimension or area of a cavity 520 from an opening of the cavity 520 to a bottom of the cavity 520. The example of cavities 520 include a first cross section (e.g., an upper cross section having a width or diameter between 20 and 100 nanometers) that is constant (e.g., cylindrical, prismatic) from a location at the opening to some distance into the one or more dielectric materials 515 (e.g., through the dielectric material 515-b and a portion of the thickness of the dielectric material 515-a), with a taper being below the first cross section (e.g., beginning at a location along the z-direction that is below an upper surface of the dielectric material 515-b). In some examples, the cavities 520 may have an opening diameter between 20 and 100 nanometers, and an overall depth between 100 and 300 nanometers. In some examples, the cavities 520 may be associated with a pitch dimension (e.g., distance of repetition along the x-direction, along the y-direction, or both, a distance between the cavity 520-a and the cavity 520-b) between 40 nanometers and 1 micrometer.

Figure 5B:
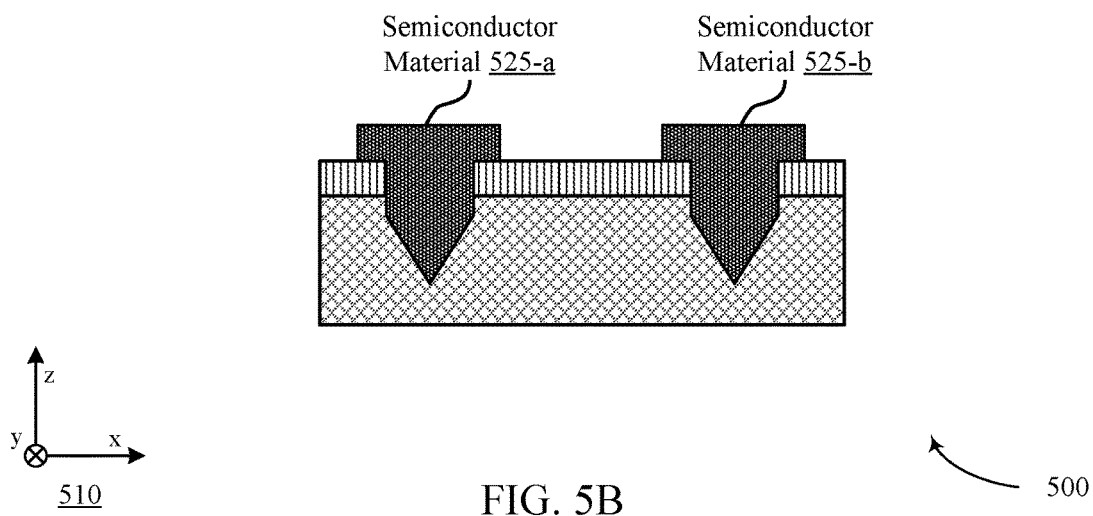

FIG. 5B illustrates a second portion of the material layout 500 after a second set of manufacturing operations, which may be similar to aspects of the second portion of the material layout 400 described with reference to FIG. 4B. For example, semiconductor materials 525 may be deposited in the cavities 520, and above the dielectric material 515-b (e.g., with a thickness dimension above a surface of the dielectric material 515-b being between 200 and 800 nanometers). In various examples, the deposited semiconductor materials 525 may include amorphous or polycrystalline silicon which, in the example of material layout 500, may be provided for the purpose of seeding respective crystalline arrangements. In some examples, the semiconductor materials 525, or a portion thereof (e.g., a portion above the dielectric material 515-b) may be patterned into islands which may be twenty percent smaller than the pitch dimension, among other percentages.

Figure 5C:
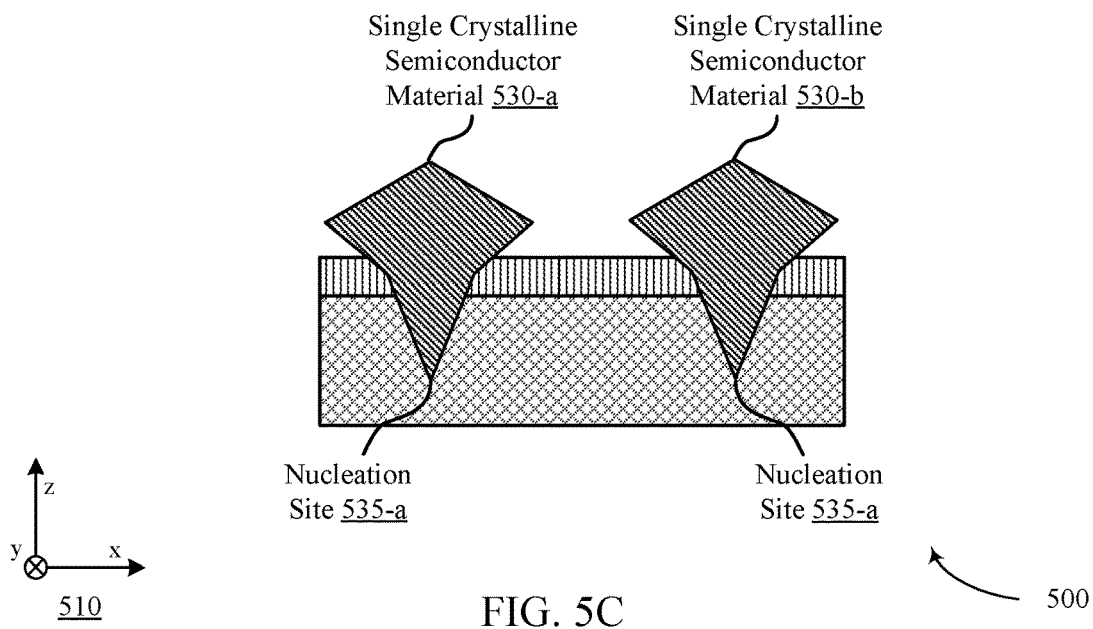
Figure 5D:
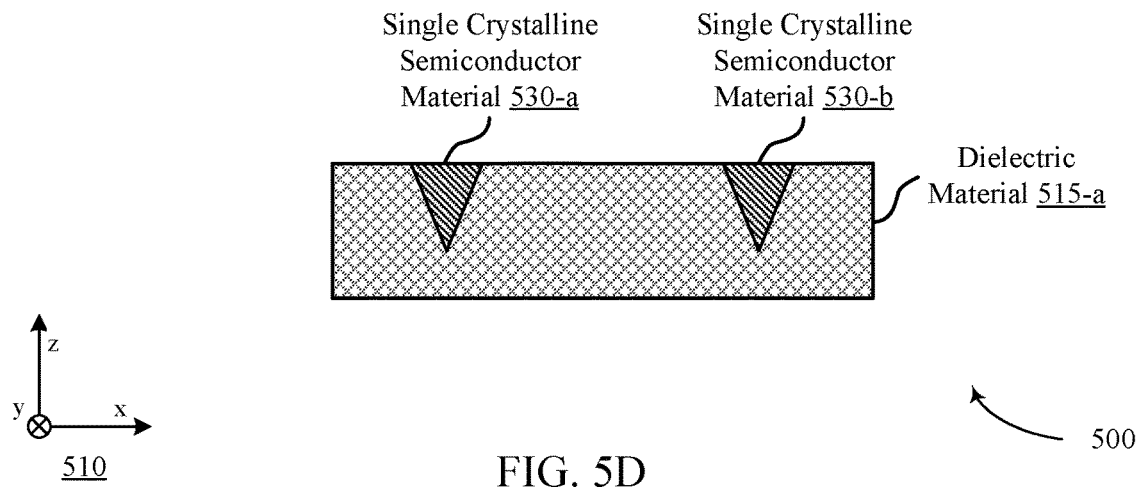

FIG. 5C illustrates a third portion of the material layout 500 after a third set of manufacturing operations, including aspects of converting the deposited semiconductor materials 525 into single crystalline semiconductor materials 530. In some examples, such a conversion may be supported by a heating and cooling (e.g., melting and annealing) of the deposited semiconductor materials 525 to form the semiconductor with respective crystalline (e.g., single crystal) arrangements.

In some cases, heating of the material layout 500 may be provided by applying a laser to the semiconductor materials 525, which may be selected or defined according to low temperature circuit applications (e.g., to avoid or mitigate thermal degradation of components below the dielectric material 515-a). For example, a laser may be applied with a wavelength between 250 and 350 nanometers (e.g., 308 nanometers) for multiple pulses each having a duration of 160 nanoseconds, or a laser may be applied with a wavelength between 500 and 600 nanometers (e.g., 532 nanometers) for a single pulse having a duration between 13 and 60 nanoseconds, among other configurations. In some examples, a duration for applying a laser to the semiconductor materials 525 may be between 10 nanoseconds and 1 microsecond.

Applying the laser may melt the semiconductor materials 525 to the bottom of the cavities 520, which may be followed by a relatively slow cooling to facilitate the formation of relatively large crystalline grains (e.g., as initiated at nucleation sites 535). In some examples, the formation of the crystalline arrangement may force a protrusion of the single crystalline semiconductor materials 530 to form humps (e.g., along the positive z-direction). In some examples, as a crystalline structure aligns in a particular direction, is may reveal structures resembling a single crystal (e.g., where a structure at 120 degrees may align with a 111 direction of the crystalline arrangement).

FIG. D illustrates a fourth portion of the material layout 500 after a fourth set of manufacturing operations, including aspects of forming a flat surface on top of the single crystalline semiconductor materials 530. For example, respective portions of the single crystalline semiconductor materials 530 may be removed by performing a CMP process, a multi-layer resist (MLR) process, a dry etching process, or a polishing process, among other techniques. In some examples, such processes may also include removing the dielectric material 515-$b$. In some examples, the remaining portion of the single crystalline semiconductor material 530 illustrated by the fourth portion may provide a seed material for subsequent growth of crystalline structures.

Figure 5E:
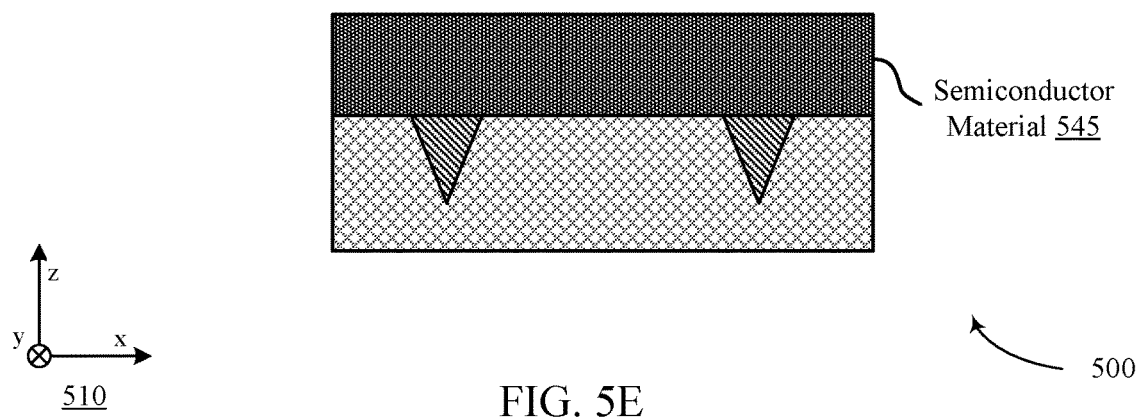

FIG. 5E illustrates a fifth portion of the material layout 500 after a fifth set of manufacturing operations, including aspects of depositing a semiconductor material 545 over the remaining portions of the single crystalline semiconductor material 530 of the fourth portion. The semiconductor material 545 may be deposited without a particular atomic arrangement, such as depositing the semiconductor material 545 with an amorphous or polycrystalline arrangement (e.g., with a thickness between 60 and 80 nanometers, among other thicknesses). In various examples, the semiconductor material 545 may be a same material as the semiconductor materials 525, or the semiconductor material 545 may be a different material than the semiconductor materials 525.

Figure 5F:
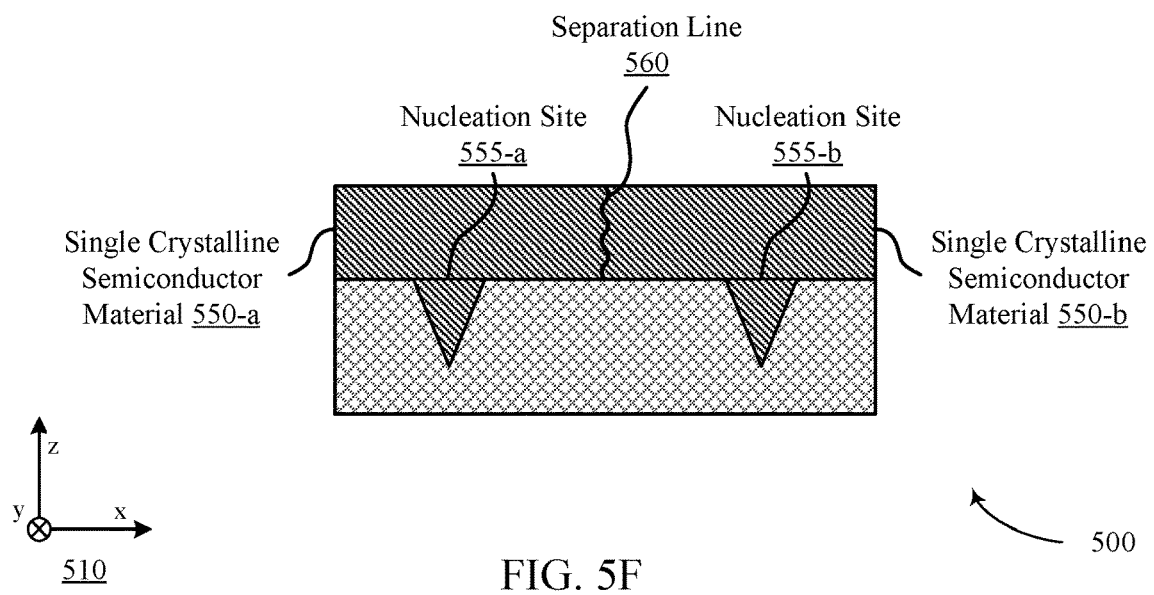

FIG. 5F illustrates a sixth portion of the material layout 500 after a sixth set of manufacturing operations, including aspects of converting the deposited semiconductor material 545 into respective single crystalline semiconductor materials 550 (e.g., single crystalline semiconductor materials 550-$a$ and 550-$b$). In some examples, such a conversion may be supported by a heating and cooling (e.g., melting and annealing) of the deposited semiconductor material 545 to form the semiconductor with respective crystalline (e.g., single crystal) arrangements, which may leverage aspects of a liquid-phase epitaxy.

In some cases, heating of the material layout 500 may be provided by applying a laser to the semiconductor material 545 (e.g., to melt the semiconductor material 545). Such melting may leverage a characteristic where an amorphous or polycrystalline arrangement of the semiconductor material 545 may have a lower melting temperature than the crystalline arrangements of the single crystalline semiconductor materials 530-$a$ and 530-$b$. Based at least in part on such characteristics, applying the laser to the semiconductor material 545 may target melting the amorphous semiconductor material and leverage the single crystalline semiconductor materials 530-$a$ and 530-$b$ to grow relatively large grains (e.g., as initiated at nucleation sites 555-$a$ and 555-$b$, which may refer to interfacing surfaces between the single crystalline semiconductor materials 530-$a$ and 530-$b$ and the semiconductor material 545. In some examples, germanium may be deposited as well (e.g., as at least a portion of the semiconductor material 545, or as a layer on top of the semiconductor material 545), which may support forming high-grade silicon germanium (e.g., in a crystalline atomic arrangement).

In some examples, growth of a crystalline arrangement may be initiated at respective nucleation sites 555, and proceed upward along the positive z-direction and laterally in an xy-plane to form respective single crystalline semiconductor materials 550 associated with each of the single crystalline semiconductor materials 530 (e.g., single crystalline semiconductor material 550-$a$ grown from or seeded by the single crystalline semiconductor material 530-$a$, single crystalline semiconductor material 550-$b$ grown from or seeded by the single crystalline semiconductor material 530-$b$). Uniformly growing grains may converge at isolation locations, such as a convergence at a separation line 560. Each of the single crystalline semiconductor materials 550 may be used to form one or more transistors, such as transistors in accordance with the transistor structure 200, which may include various techniques of doping the single crystalline semiconductor materials 550. For example, each of the single crystalline semiconductor materials 550 may be an example of a respective semiconductor material 220, and may be doped to form one or more doped portions 240. In some examples, separation lines 560, and adjacent portions of the single crystalline semiconductor materials 550, may be removed and replaced with isolation features during die fabrication (e.g., to form one or more transistors from the single crystalline semiconductor materials 550), which may support forming circuitry using relatively high quality semiconductor (e.g., for doped portions 240 that do not include grain boundaries, such as the separation line 560).

FIGS. 6A through 6F illustrate examples of operations that support forming single-crystal transistors for memory devices in accordance with examples as disclosed herein. For example, FIGS. 6A through 6F may illustrate aspect of a sequence of operations for fabricating a material layout 600, which may be a portion of a memory device (e.g., a memory device 100, a memory device 300, a memory die), such as a portion of an upper circuitry region 320 described with reference to FIG. 3. However, the described techniques may be implemented to support fabricating other portions of a memory device, or other types of semiconductor dies that include forming crystalline atomic arrangements of a semiconductor material that is deposited over a substrate. Each of the figures may be described with reference to an x-direction, a y-direction, and a z-direction of a coordinate system 510. Operations illustrated in and described with reference to FIGS. 6A through 6F may be performed by a manufacturing system, such as a semiconductor fabrication system configured to perform additive operations such as deposition or bonding, subtractive operations such as etching, trenching, planarizing, or polishing, and supporting operations such as masking, photolithography, or aligning, among other operations that support the described techniques.

Figure 6A:
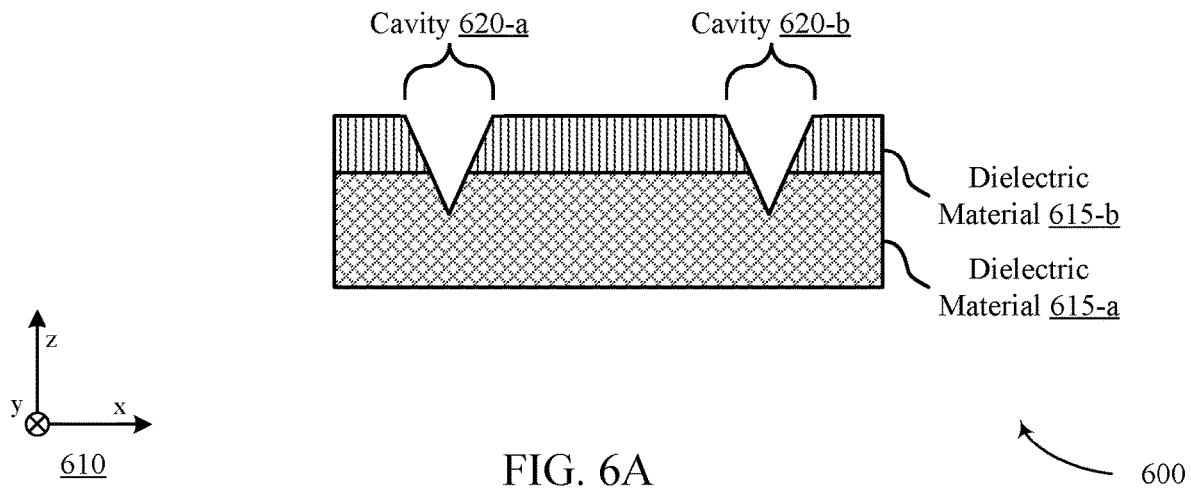
FIGS. 6A through 6F illustrate examples of operations that support forming single-crystal transistors for memory devices in accordance with examples as disclosed herein.

FIG. 6A illustrates a first portion of the material layout 600 after a first set of manufacturing operations, which may be similar to aspects of the first portion of the material layout 400 described with reference to FIG. 4A. For example, the first portion of the material layout 500 may include a dielectric material 615-$a$ and a dielectric material 615-$b$, which may be deposited over one or more arrays of memory cells 105 (e.g., in an upper circuitry region 320) or in another portion of semiconductor die. In some examples, the dielectric material 615-$a$ may include an oxide material (e.g., an oxide of silicon having a thickness between 300 and 500 nanometers) and the dielectric material 615-$b$ may include a nitride material (e.g., a nitride of silicon having a thickness between 20 and 60 nanometers). Although two dielectric materials 615 are illustrated, a material layout in accordance with the described techniques may include any quantity of one or more layers of dielectric material 615, which may include multiple layers of a same material, or layers of two or more different materials, or both.

As illustrated in the material layout 600, cavities 620 may be etched or otherwise formed in the one or more dielectric materials 615, and may have one or more characteristics similar to those described with reference to the cavities 420 of the material layout 400. For example, each of the cavities 620 may include a taper along the z-direction (e.g., toward a point), which may refer to various examples of a reduction in cross-sectional dimension or area of a cavity 620 from an opening of the cavity 620 to a bottom of the cavity 620. In some examples, the cavities 620 may have an opening diameter between 20 and 100 nanometers, and an overall depth between 100 and 300 nanometers. In some examples, the cavities 520 may be associated with a pitch dimension (e.g., distance of repetition along the x-direction, along the y-direction, or both, a distance between the cavity 520-a and the cavity 520-b) between 40 nanometers and 1 micrometer.

Figure 6B:
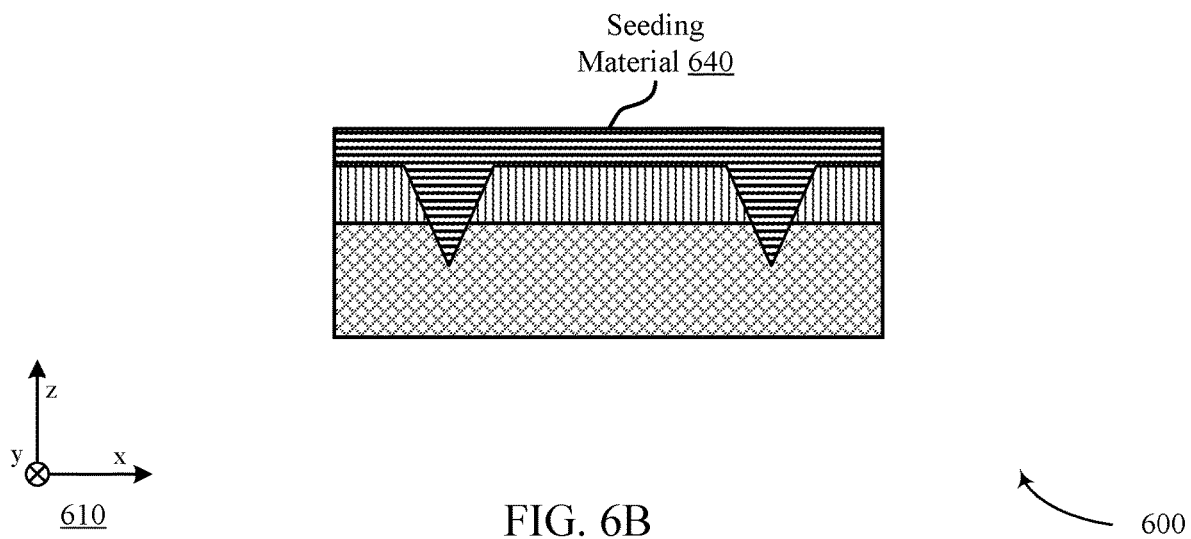

FIG. 6B illustrates a second portion of the material layout 600 after a second set of manufacturing operations, which may include aspects of a seeding material 640 (e.g., a seed layer) deposited over the dielectric materials 615. In some examples, the seeding material 640 may include nickel, which may support aspects of metal-induced semiconductor crystallization. In some examples, the seeding material 640 may include silicon-germanium, amorphous silicon, a metal silicide, or polysilicon, among other seeding materials.

Figure 6C:
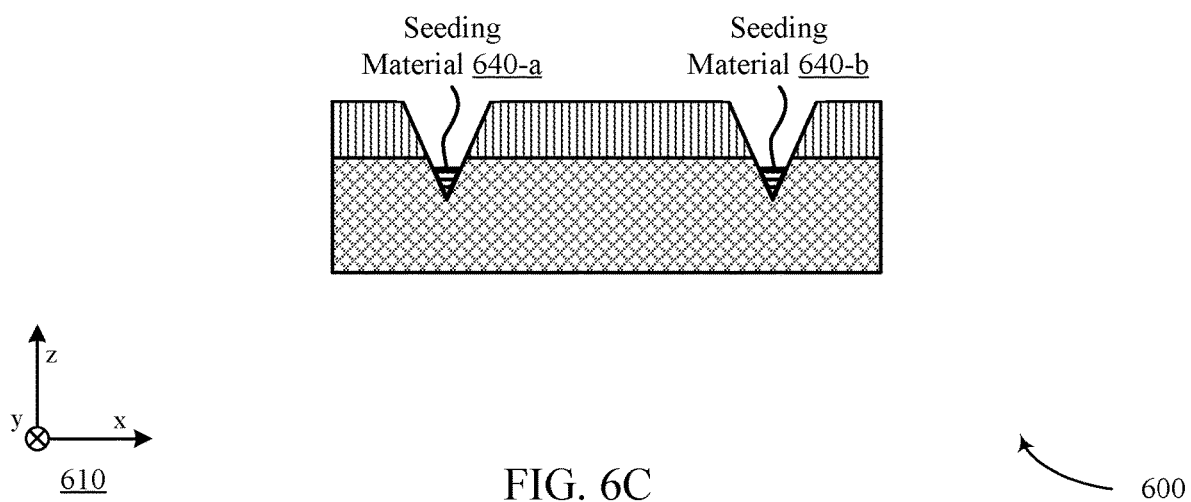

FIG. 6C illustrates a third portion of the material layout 600 after a third set of manufacturing operations, which may include aspects of removing a portion of the seeding material 640. For example, the seeding material 640 may be recessed such that each cavity 620 is at least partially filled with the seeding material 640, such that remaining portions of the seeding material (e.g., seeding material 640-a and 640-b) may be within a tapered region of the cavities 620.

Figure 6D:
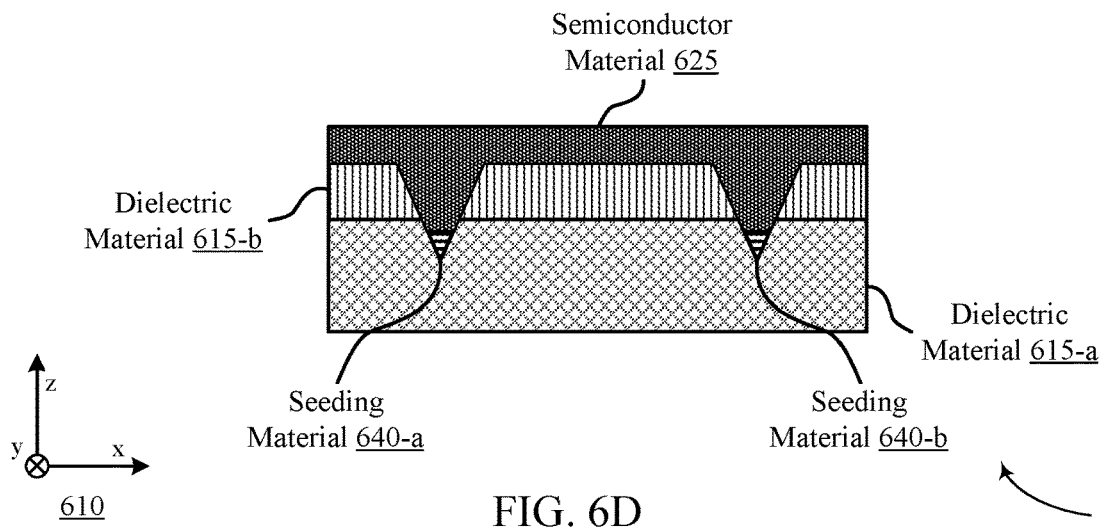

FIG. 6D illustrates a fourth portion of the material layout 600 after a fourth set of manufacturing operations, including aspects of a semiconductor material 625 deposited over the dielectric materials 615 and remaining seeding materials 640-a and 640-b. In some examples, the deposition of the semiconductor material 625 may be similar to aspects of the deposition of the semiconductor materials 425, 525, or 545 described with reference to FIGS. 4B, 5B, and 5E. For example, the semiconductor material 625 may be deposited without a particular atomic arrangement, such as depositing the semiconductor material 625 with an amorphous or polycrystalline arrangement. In some examples, the semiconductor material 625 may be deposited with a thickness dimension above a surface of the dielectric material 615-b being between 200 and 800 nanometers.

Figure 6E:
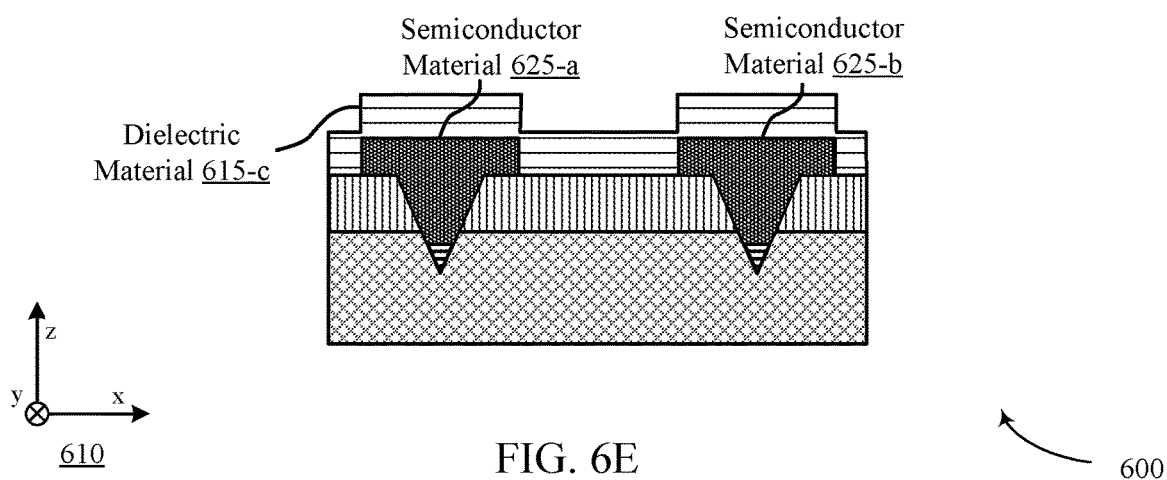

FIG. 6E illustrates a fifth portion of the material layout 600 after a fifth set of manufacturing operations, including aspects of dividing or patterning the semiconductor material 625 into islands (e.g., semiconductor materials 625-a and 625-b). In some examples, the semiconductor material 625 may be patterned into islands that are twenty percent smaller than a pitch dimension between cavities 620, among other percentages. In some examples, after forming the semiconductor materials 625-a and 625-b, a dielectric material 615-c may optionally be deposited over the semiconductor materials 625-a and 625-b and the dielectric material 615-b, which may encapsulate structures, reduce or eliminate interference or contamination from a chamber environment, or help to control heat transfer, among other benefits. In some cases, the dielectric material 415-c may include a tetraethoxysilane material or an oxide material.

Figure 6F:
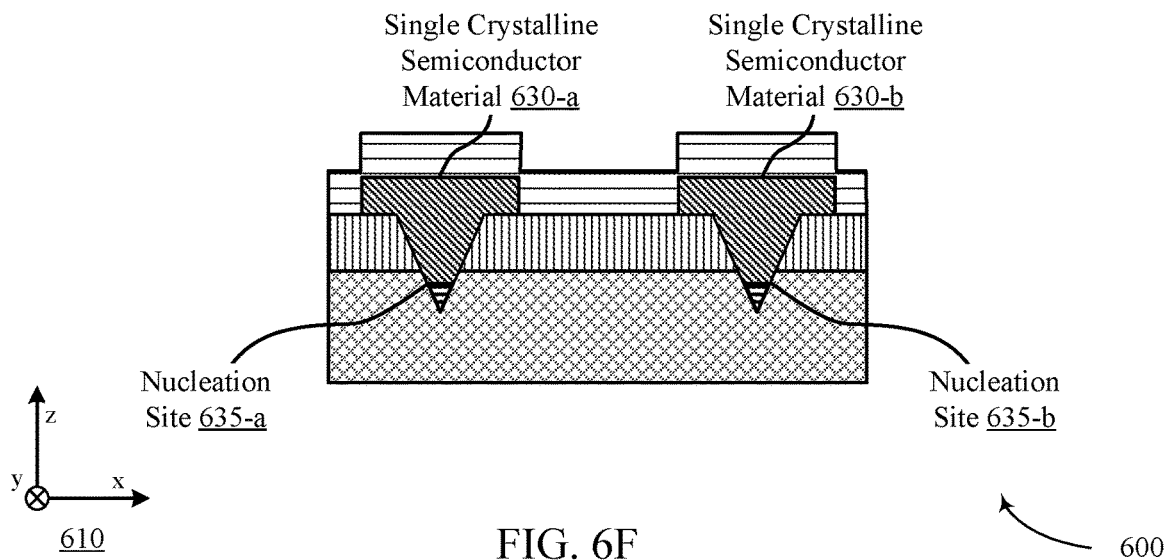

FIG. 6F illustrates a sixth portion of the material layout 600 after a sixth set of manufacturing operations, including aspects of converting the portions of deposited semiconductor material 625 into respective single crystalline semiconductor materials 630 (e.g., single crystalline semiconductor materials 630-a and 630-b). In some examples, such a conversion may be supported by a heating and cooling (e.g., melting and annealing) of the portions of deposited semiconductor material 625 to form the semiconductor with respective crystalline (e.g., single crystal) arrangements, which may leverage aspects of a liquid-phase epitaxy (e.g., when the seeding materials 640 have a different composition than the semiconductor material 625) or aspects of a liquid-phase homoepitaxy (e.g., when the seeding materials 640 have a same composition as the semiconductor material 625).

In some cases, heating of the material layout 600 may be provided by applying a laser to the semiconductor materials 625 or the dielectric material 615-c (e.g., where applicable). In some examples, a laser may be applied with a single pulse (e.g., over a single duration). For example, a laser having a wavelength between 400 and 700 nanometers (e.g., 532 nanometers) may be applied for a configured duration, which may include a 60-second dwell time. In some examples, a laser may be applied with multiple pulses. For example, a laser having a wavelength between 150 and 450 nanometers (e.g., between 250 and 350 nanometers, 308 nanometers) may be applied for a quantity of pulses each having a configured duration or energy (e.g., 0.4 joules, 0.5 joules, 0.6 joules). In some examples, a duration for applying a laser to the semiconductor materials 625 may be between 10 nanoseconds and 1 microsecond. In some examples, such melting may leverage a characteristic where an amorphous or polycrystalline arrangement of the semiconductor material 625 may have a lower melting temperature than the seeding material 640.

In some examples, growth of a crystalline arrangement may be initiated at respective nucleation sites 635, and proceed upward along the positive z-direction and laterally in an xy-plane to form respective single crystalline semiconductor materials 630 associated with each of the seeding materials 640 (e.g., single crystalline semiconductor material 630-a seeded by the seeding material 640-a, single crystalline semiconductor material 630-b seeded by the seeding material 640-b). Each of the single crystalline semiconductor materials 630 may be used to form one or more transistors, such as transistors in accordance with the transistor structure 200, which may include various techniques of doping the single crystalline semiconductor materials 630. For example, each of the single crystalline semiconductor materials 630 may be an example of a respective semiconductor material 220, and may be doped to form one or more doped portions 240. In examples of the material layout 600 that include the dielectric material 615-c, the dielectric material 615-c may be removed partially or entirely (e.g., using a chemical mechanical polishing (CMP) process) before doping operations to form one or more transistors.

Figure 7:
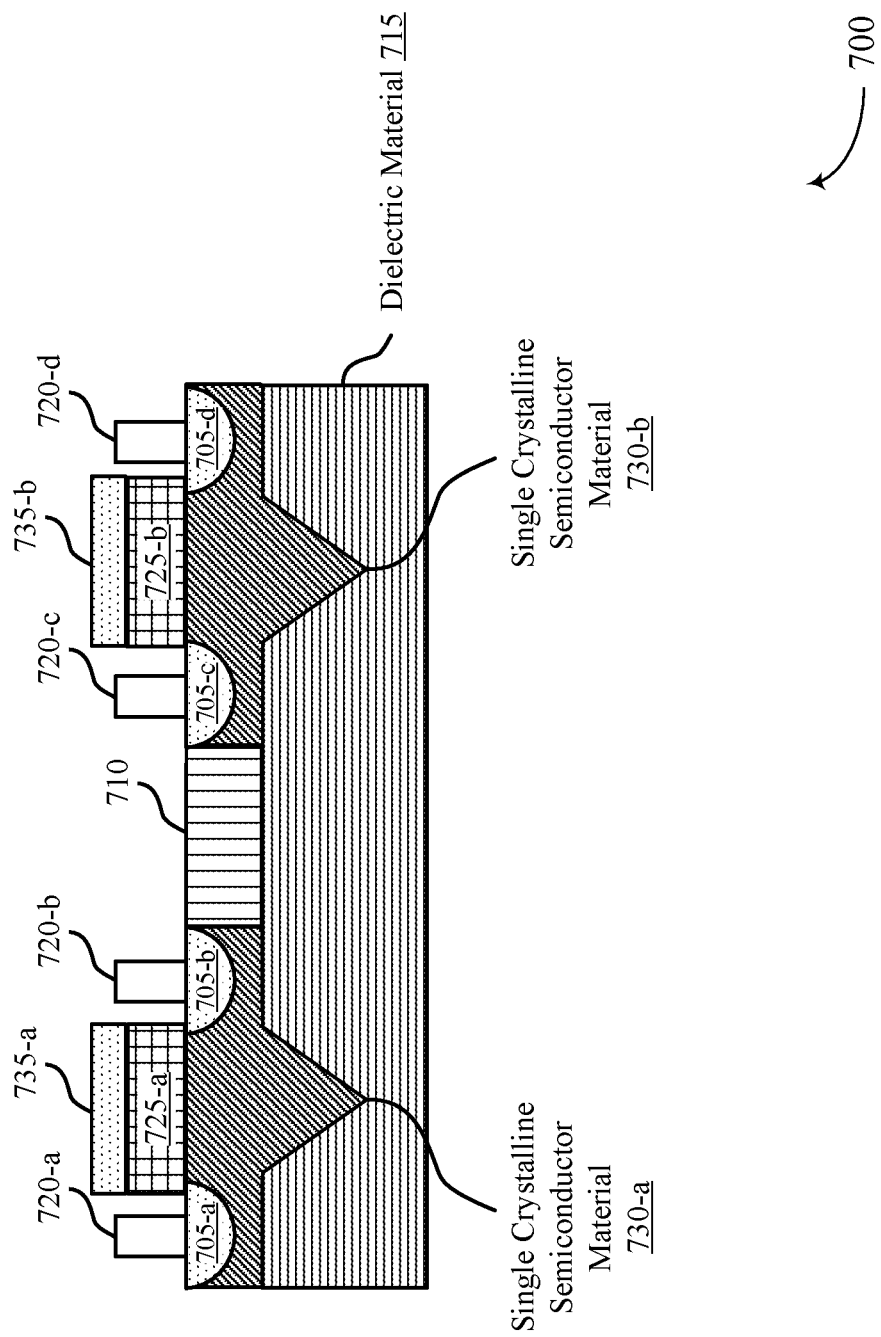
FIG. 7 illustrates example transistors that support single-crystal transistors for memory devices in accordance with examples as disclosed herein.

FIG. 7 illustrates an example of a transistor layout 700 that supports single-crystal transistors for memory devices in accordance with examples as disclosed herein. For example, the transistor layout 700 may be formed using additional fabrication operations performed on any of the material layouts 400, 500 or 600 (e.g., as illustrated in FIGS. 4C, 5F, or 6F). Accordingly, the transistor layout 700 may be illustrative of transistors that may be formed above a deck or array of memory cells 105.

The transistor layout 700 may include a dielectric material 715, which may be an example of any of dielectric materials 415, 515, or 615, and single crystalline semiconductor materials 730, which may be examples of any of the single crystalline semiconductor materials 430, 550, or 630 (e.g., formed based on heating and cooling a deposited semiconductor material). The single crystalline semiconductor materials 730 may each include a single crystal grain (e.g., a single atomic arrangement), at least in portions of the respective single crystalline semiconductor material 730 that support a channel of a corresponding transistor (e.g., doped regions 705 or other portions of the single crystalline semiconductor material 730 between doped regions 705 that support a channel of the corresponding transistor). For example, outside a channel portion of a given transistor, the volume of a respective single crystalline semiconductor material 730 may include other crystalline grains, or inadvertent or otherwise insignificant grain nucleations (e.g., near a surface adjacent to dielectric material 715), or other dislocations, that may not adversely affect the operation or characteristics of the given transistor.

To form transistors, the transistor layout 700 illustrates channel portions formed at least in part by doping the single crystalline semiconductor materials 730. For example, the transistor layout 700 may include doped regions 705, which may correspond to doped portions 240 (e.g., doped portions 240-*a*-1 and 240-*a*-2) described with reference to the transistor structure 200 of FIG. 2. In some examples, at least a portion of the single crystalline semiconductor materials 730 that are outside the illustrated doped regions 705 may also be doped, such that a boundary between a doped region 705 and adjacent portions of the single crystalline semiconductor materials 730 may correspond to a boundary between one type of doped semiconductor and another type of doped semiconductor (e.g., to form an NPN configuration or a PNP configuration). In various examples, portions of the single crystalline semiconductor materials 730 located in respective cavities may or may not be used to support a channel (e.g., may not be used to support electrical conductivity between terminals 720), and accordingly may or may not be doped (e.g., when such portions of the single crystalline semiconductor materials 730 are dedicated to nucleation and grain growth).

The transistor layout 700 may also include terminals 720 that may be deposited over (e.g., in contact with) the doped regions 705, which may correspond to terminals 270 as described with reference to FIG. 2). For example, the terminal 720-*a* may be deposited over and in contact with the doped region 705-*a* and the terminal 720-*b* may be deposited over and in contact with the doped region 705-*b*, and so on. The transistor layout 700 may also include gate dielectric portions 725, and gate conductors 735 that may be formed over the gate dielectric portions 725, which may be examples of gate insulation portions 260 and gate portions 250, respectively. Thus, according to these and other techniques and transistor configurations, transistor circuitry may be formed from one or more portions of a semiconductor that is formed in a crystalline arrangement by heating and cooling (e.g., melting and annealing) a semiconductor material that is deposited over a substrate, such as a semiconductor material that is deposited over an array of memory cells 105. In some examples, such transistors, or channel portions thereof, may be isolated from each other by a dielectric material 710.

Figure 8:
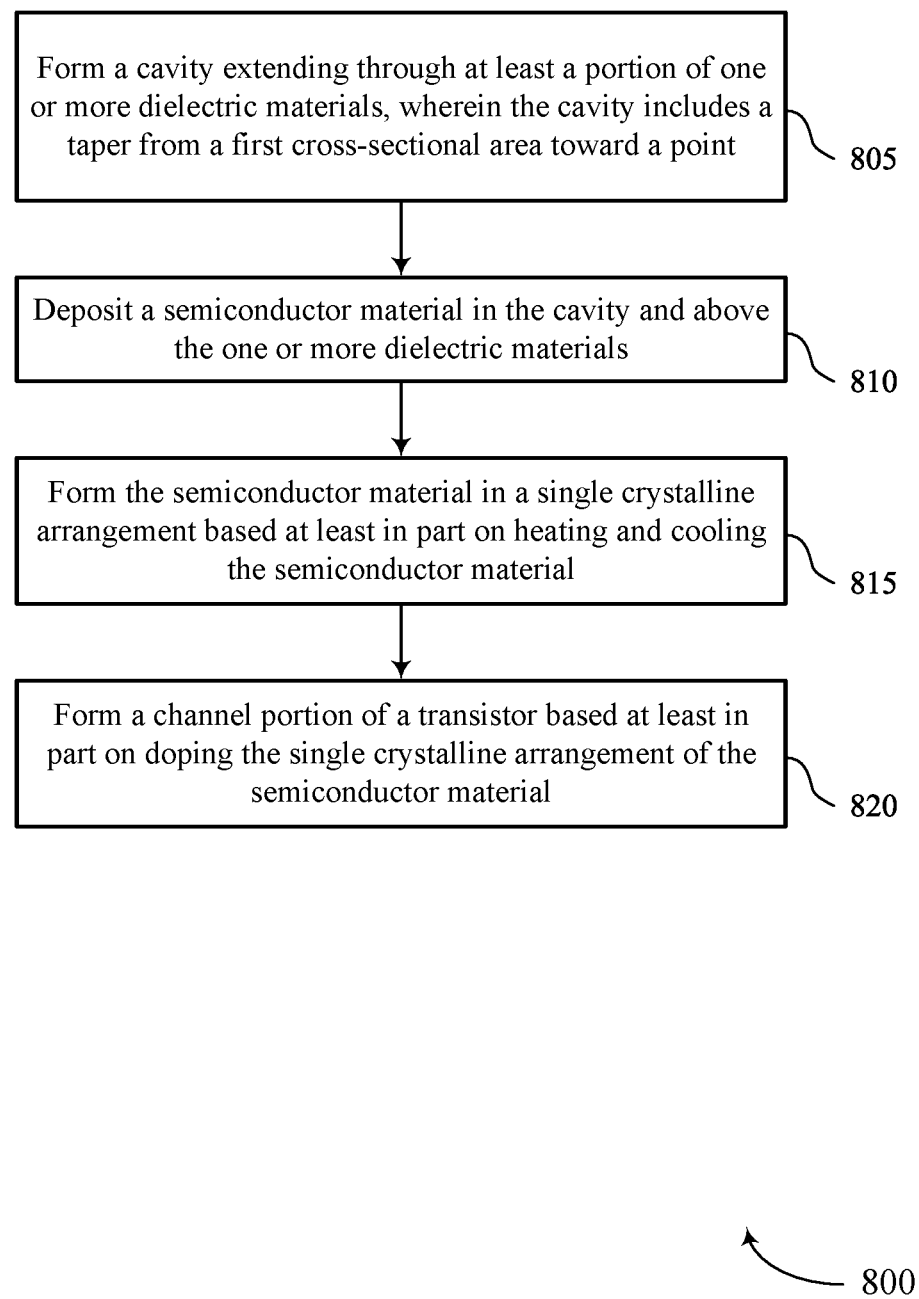
FIGS. 8 and 9 show flowcharts illustrating a method or methods that support single-crystal transistors for memory devices in accordance with examples as disclosed herein.

FIG. 8 shows a flowchart illustrating a method 800 that supports single-crystal transistors for memory devices in accordance with examples as disclosed herein. The operations of method 800 may be implemented by a manufacturing system or one or more controllers associated with a manufacturing system. In some examples, one or more controllers may execute a set of instructions to control one or more functional elements of the manufacturing system to perform the described functions. Additionally or alternatively, the one or more controllers may perform aspects of the described functions using special-purpose hardware.

At 805, the method may include forming a cavity extending through at least a portion of one or more dielectric materials, where the cavity includes a taper from a first cross-sectional area toward a point. The operations of 805 may be performed in accordance with examples and techniques as disclosed herein, including one or more aspects described with reference to FIGS. 1 through 7.

At 810, the method may include depositing a semiconductor material in the cavity and above the one or more dielectric materials. The operations of 810 may be performed in accordance with examples and techniques as disclosed herein, including one or more aspects described with reference to FIGS. 1 through 7.

At 815, the method may include forming the semiconductor material in a single crystalline arrangement based at least in part on heating and cooling the semiconductor material. The operations of 815 may be performed in accordance with examples and techniques as disclosed herein, including one or more aspects described with reference to FIGS. 1 through 7.

At 820, the method may include forming a channel portion of a transistor based at least in part on doping the single crystalline arrangement of the semiconductor material. The operations of 820 may be performed in accordance with examples and techniques as disclosed herein, including one or more aspects described with reference to FIGS. 1 through 7.

In some examples, an apparatus as described herein may be manufactured (e.g., fabricated) according to a method or methods, such as the method 800. A system for manufacturing the apparatus may include, features, circuitry, logic, means, or instructions (e.g., a non-transitory computer-readable medium storing instructions executable by a processor) for forming a cavity extending through at least a portion of one or more dielectric materials, where the cavity includes a taper from a first cross-sectional area toward a point, depositing a semiconductor material in the cavity and above the one or more dielectric materials, forming the semiconductor material in a single crystalline arrangement based at least in part on heating and cooling the semiconductor material, and forming a channel portion of a transistor based at least in part on doping the single crystalline arrangement of the semiconductor material.

In some examples of the method 800 and the system for manufacturing described herein, forming the single crystalline arrangement of the semiconductor material may include operations, features, circuitry, logic, means, or instructions for nucleating the single crystalline arrangement of the semiconductor material at a nucleation site at an end of the cavity opposite from an opening of the cavity.

In some examples of the method 800 and the system for manufacturing described herein, heating the semiconductor material may include operations, features, circuitry, logic, means, or instructions for applying a laser to the semiconductor material.

In some examples of the method 800 and the system for manufacturing described herein, applying the laser to the semiconductor material may include operations, features, circuitry, logic, means, or instructions for applying the laser with a wavelength between 500 and 600 nanometers, or for a single pulse having a duration between 10 nanoseconds and 1 microsecond (e.g. between 10 and 70 nanoseconds), or both.

In some examples of the method 800 and the system for manufacturing described herein, applying the laser to the semiconductor material may include operations, features, circuitry, logic, means, or instructions for applying the laser with a wavelength between 250 and 350 nanometers, or for a set of one or more pulses each having a duration between 100 and 200 nanoseconds, or both.

In some examples of the method 800 and the system for manufacturing described herein, a cross-sectional area of the cavity at an end opposite from an opening of the cavity may be less than 30% of a cross-sectional area of the opening of the cavity.

In some examples of the method 800 and the system for manufacturing described herein, the taper of the cavity may be associated with an included angle that is between 35 degrees and 55 degrees.

In some examples of the method 800 and the system for manufacturing described herein, a cross-sectional area of the cavity at an end opposite from an opening of the cavity may have a width of less than or equal to 7 nanometers.

In some examples of the method 800 and the system for manufacturing described herein, depositing the semiconductor material may include operations, features, circuitry, logic, means, or instructions for depositing the semiconductor material with an amorphous arrangement or a polycrystalline arrangement.

Some examples of the method 800 and the system for manufacturing described herein may further include operations, features, circuitry, logic, means, or instructions for depositing a dielectric material over the semiconductor material. In some examples, forming the semiconductor material in the single crystalline arrangement may be based at least in part on depositing the dielectric material.

Some examples of the method 800 and the system for manufacturing described herein may further include operations, features, circuitry, logic, means, or instructions for depositing, in the cavity, a second material before depositing the semiconductor material. In some examples, forming the single crystalline arrangement of the semiconductor material may be based at least in part on a nucleation of the single crystalline arrangement at an interface between the second material and the semiconductor material. In some examples of the method 800 and the system for manufacturing described herein, the second material may include silicon-germanium, amorphous silicon, nickel, a metal silicide, or polysilicon.

Some examples of the method 800 and the system for manufacturing described herein may further include operations, features, circuitry, logic, means, or instructions forming the one or more dielectric materials based at least in part on depositing a first dielectric material and depositing a second dielectric material over the first dielectric material. In some examples, forming the cavity may include forming the cavity with the taper through at least a portion of the first dielectric material.

In some examples of the method 800 and the system for manufacturing described herein, the first dielectric material may have a first thermal conductivity, and the second dielectric material may have a second thermal conductivity that is less than the first thermal conductivity.

In some examples of the method 800 and the system for manufacturing described herein, the first dielectric material may include an oxide material, and the second dielectric material may include a nitride material.

Some examples of the method 800 and the system for manufacturing described herein may further include operations, features, circuitry, logic, means, or instructions forming a first terminal conductor of the transistor in contact with a first portion of the channel portion, forming a second terminal conductor of the transistor in contact with a second portion of the channel portion, forming a gate dielectric in contact with a third portion of the channel portion that is between the first portion and the second portion, and forming a gate conductor of the transistor over the gate dielectric.

Figure 9:
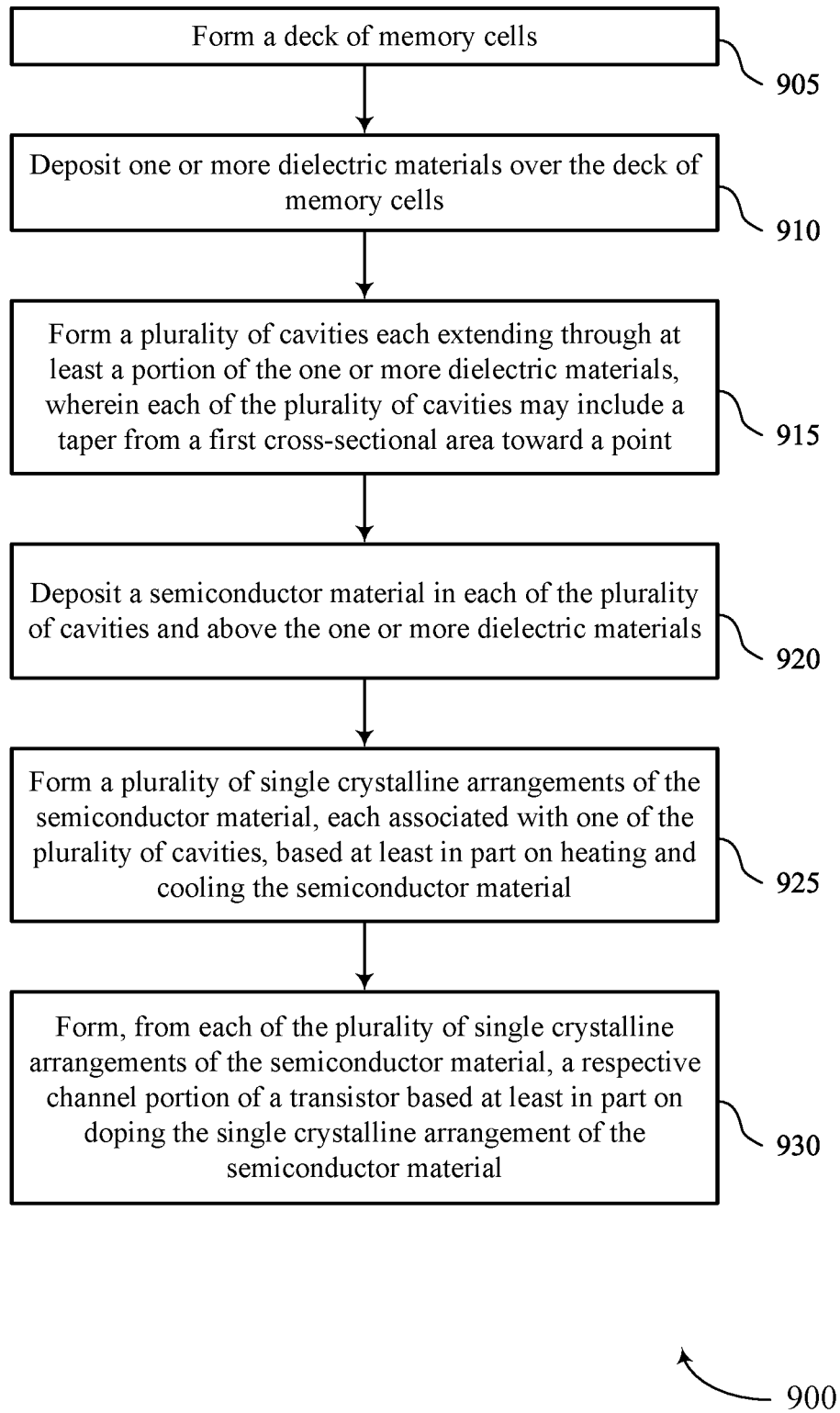

FIG. 9 shows a flowchart illustrating a method 900 that supports single-crystal transistors for memory devices in accordance with examples as disclosed herein. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, the one or more controllers may perform aspects of the described functions using special-purpose hardware.

At 905, the method may include forming a deck of memory cells. In some examples, aspects of the operations of 905 may be performed in accordance with examples and techniques as disclosed herein, including one or more aspects described with reference to FIGS. 1 through 7.

At 910, the method may include depositing one or more dielectric materials over the deck of memory cells. The operations of 910 may be performed in accordance with examples and techniques as disclosed herein, including one or more aspects described with reference to FIGS. 1 through 7.

At 915, the method may include forming a plurality of cavities each extending through at least a portion of the one or more dielectric materials, where each of the plurality of cavities may include a taper from a first cross-sectional area toward a point. The operations of 915 may be performed in accordance with examples and techniques as disclosed herein, including one or more aspects described with reference to FIGS. 1 through 7.

At 920, the method may include depositing a semiconductor material in each of the plurality of cavities and above the one or more dielectric materials. The operations of 920 may be performed in accordance with examples and techniques as disclosed herein, including one or more aspects described with reference to FIGS. 1 through 7.

At 925, the method may include forming a plurality of single crystalline arrangements of the semiconductor material, each associated with one of the plurality of cavities, based at least in part on heating and cooling the semiconductor material. The operations of 925 may be performed in accordance with examples and techniques as disclosed herein, including one or more aspects described with reference to FIGS. 1 through 7.

At 930, the method may include forming, from each of the plurality of single crystalline arrangements of the semiconductor material, a respective channel portion of a transistor based at least in part on doping the single crystalline arrangement of the semiconductor material. The operations of 930 may be performed in accordance with examples and techniques as disclosed herein, including one or more aspects described with reference to FIGS. 1 through 7.

In some examples, an apparatus as described herein may be manufactured (e.g., fabricated) according to a method or methods, such as the method 900. A system for manufacturing the apparatus may include, features, circuitry, logic, means, or instructions (e.g., a non-transitory computer-readable medium storing instructions executable by a processor) for forming a deck of memory cells, depositing one or more dielectric materials over the deck of memory cells, forming a plurality of cavities each extending through at least a portion of the one or more dielectric materials, where each of the plurality of cavities may include a taper from a first cross-sectional area toward a point, depositing a semiconductor material in each of the plurality of cavities and above the one or more dielectric materials, forming a plurality of single crystalline arrangements of the semiconductor material, each associated with one of the plurality of cavities, based at least in part on heating and cooling the semiconductor material, and forming, from each of the plurality of single crystalline arrangements of the semiconductor material, a respective channel portion of a transistor based at least in part on doping the single crystalline arrangement of the semiconductor material.

Some examples of the method 900 and the system for manufacturing described herein may further include operations, features, circuitry, logic, means, or instructions for patterning the semiconductor material that is above the one or more dielectric materials and between each of the plurality of cavities to expose a surface of the one or more dielectric materials between each of the plurality of cavities. In some examples, forming the plurality of single crystalline arrangements of the semiconductor material may be based at least in part on the patterning.

Some examples of the method 900 and the system for manufacturing described herein may further include operations, features, circuitry, logic, means, or instructions for depositing a dielectric material in contact with the patterned semiconductor material and the exposed surface of the one or more dielectric materials. In some examples, forming the plurality of single crystalline arrangements of the semiconductor material may be based at least in part on depositing the dielectric material.

In some examples of the method 900 and the system for manufacturing described herein, forming the plurality of single crystalline arrangements of the semiconductor material may include operations, features, circuitry, logic, means, or instructions for nucleating each of the single crystalline arrangements of the semiconductor material at a respective nucleation site at an end of a respective cavity opposite from an opening of the respective cavity.

In some examples of the method 900 and the system for manufacturing described herein, heating the semiconductor material may include operations, features, circuitry, logic, means, or instructions for applying a laser to at least the dielectric material and the semiconductor material.

In some examples of the method 900 and the system for manufacturing described herein, depositing the semiconductor material may include operations, features, circuitry, logic, means, or instructions for depositing the semiconductor material with an amorphous arrangement or a polycrystalline arrangement.

Some examples of the method 900 and the system for manufacturing described herein may further include operations, features, circuitry, logic, means, or instructions for, depositing, in each of the plurality of cavities, a second material before depositing the semiconductor material. In some examples, forming the plurality of single crystalline arrangements of the semiconductor material may be based at least in part on a nucleation of the single crystalline arrangements at respective interfaces between the second material and the semiconductor material.

Some examples of the method 900 and the system for manufacturing described herein may further include operations, features, circuitry, logic, means, or instructions for forming the one or more dielectric materials based at least in part on depositing a first dielectric material and depositing a second dielectric material over the first dielectric material. In some examples, forming the plurality of cavities may include forming each of the plurality of cavities with the respective taper through at least a portion of the first dielectric material.

Some examples of the method 900 and the system for manufacturing described herein, may further include operations, features, circuitry, logic, means, or instructions for forming, for each transistor of the plurality, a first terminal conductor of the transistor in contact with a first portion of the channel portion, a second terminal conductor of the transistor in contact with a second portion of the channel portion, a gate dielectric in contact with a third portion of the channel portion that is between the first portion and the second portion, and a gate conductor of the transistor over the gate dielectric.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a dielectric portion and a semiconductor portion in contact with a top surface of the dielectric portion and extending into the dielectric portion with a tapered projection, the semiconductor portion including a single-grain crystalline arrangement. The apparatus may further include a first transistor terminal in contact with a top surface of the semiconductor portion at a first location, a second transistor terminal in contact with the top surface of the semiconductor portion at a second location, a transistor gate dielectric in contact with the top surface of the semiconductor portion at a third location between the first location and the second location, and a transistor gate conductor in contact with a top surface of the transistor gate dielectric.

In some examples of the apparatus, the semiconductor portion may include a first doped region in contact with the first transistor terminal and a second doped region in contact with the second transistor terminal.

In some examples of the apparatus, the dielectric portion may include a first dielectric layer having a first thermal conductivity and a second dielectric layer over the first dielectric layer, the second dielectric layer having a second thermal conductivity that is less than the first thermal conductivity.

In some examples of the apparatus, the first dielectric layer may include an oxide material and the second dielectric layer may include a nitride material.

In some examples, the apparatus may include a material portion between an end of the tapered projection of the semiconductor portion and the dielectric portion, the material portion including silicon-germanium, nickel, a metal silicide, or polysilicon.

Another apparatus is described. The apparatus may include a deck of memory cells, a dielectric portion above the deck of memory cells, and a plurality of transistors coupled with the deck of memory cells. Each transistor of the plurality of transistors may include a semiconductor portion in contact with a top surface of the dielectric portion, the semiconductor portion including a single-grain crystalline arrangement and having a tapered extension into the dielectric portion, a first terminal in contact with a first portion of a top surface of the semiconductor portion, a second terminal in contact with a second portion of the top surface of the semiconductor portion, and a gate conductor operable to modulate a conductivity of the semiconductor portion between the first terminal and the second terminal.

In some examples, the apparatus may include a second dielectric material between each of the plurality of transistors. In some examples, each sidewall of the second dielectric material may be in contact with a sidewall of the semiconductor portion, and a bottom surface of the second dielectric material may be in contact with a top surface of the dielectric portion.

In some examples of the apparatus, the dielectric portion may include a first dielectric layer having a first thermal conductivity and a second dielectric layer over the first dielectric layer, the second dielectric layer having a second thermal conductivity that is less than the first thermal conductivity.

A transistor is described. The transistor may be formed by a process of forming a cavity extending through at least a portion of one or more dielectric materials, where the cavity includes a taper from a first cross-sectional area toward a point, depositing a semiconductor material in the cavity and above the one or more dielectric materials, forming the semiconductor material in a single crystalline arrangement based at least in part on heating and cooling the semiconductor material, and forming a channel portion of the transistor based at least in part on doping the single crystalline arrangement of the semiconductor material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   forming a cavity within a dielectric portion including one or more dielectric materials, wherein the cavity within the dielectric portion includes a taper from a first cross-sectional area toward a point;
   depositing a semiconductor material in the cavity within the dielectric portion and above the one or more dielectric materials;
   forming the semiconductor material in a single crystalline arrangement after depositing the semiconductor material in the cavity within the dielectric portion, wherein forming the single crystalline arrangement comprises nucleating the single crystalline arrangement based at least in part on heating and cooling the semiconductor material; and
   forming a channel portion of a transistor based at least in part on doping the single crystalline arrangement of the semiconductor material.

2. The method of claim 1, wherein forming the single crystalline arrangement of the semiconductor material comprises:
   nucleating the single crystalline arrangement of the semiconductor material at a nucleation site at an end of the cavity opposite from an opening of the cavity.

3. The method of claim 1, wherein heating the semiconductor material comprises:
   applying a laser to the semiconductor material.

4. The method of claim 3, wherein applying the laser to the semiconductor material comprises:

applying the laser with a wavelength between 500 and 600 nanometers for a single pulse having a duration between 10 nanoseconds and 1 microsecond.

5. The method of claim 3, wherein applying the laser to the semiconductor material comprises:
applying the laser with a wavelength between 250 and 350 nanometers for a set of one or more pulses each having a duration between 100 and 200 nanoseconds.

6. The method of claim 1, wherein a cross-sectional area of the cavity at an end opposite from an opening of the cavity is less than 30% of a cross-sectional area of the opening of the cavity.

7. The method of claim 1, wherein the taper of the cavity is associated with an included angle that is between 35 degrees and 55 degrees.

8. The method of claim 1, wherein a cross-sectional area of the cavity at an end opposite from an opening of the cavity has a width of less than or equal to 7 nanometers.

9. The method of claim 1, wherein depositing the semiconductor material comprises:
depositing the semiconductor material with an amorphous arrangement or a polycrystalline arrangement.

10. The method of claim 1, further comprising:
depositing a dielectric material over the semiconductor material, wherein forming the semiconductor material in the single crystalline arrangement is based at least in part on depositing the dielectric material.

11. The method of claim 1, further comprising:
depositing, in the cavity, a second material before depositing the semiconductor material, wherein forming the single crystalline arrangement of the semiconductor material is based at least in part on a nucleation of the single crystalline arrangement at an interface between the second material and the semiconductor material.

12. The method of claim 11, wherein the second material comprises silicon-germanium, amorphous silicon, nickel, a metal silicide, or polysilicon.

13. The method of claim 1, further comprising:
forming the one or more dielectric materials based at least in part on depositing a first dielectric material and depositing a second dielectric material over the first dielectric material, wherein forming the cavity comprises forming the cavity with the taper through at least a portion of the first dielectric material.

14. The method of claim 13, wherein:
the first dielectric material has a first thermal conductivity; and
the second dielectric material has a second thermal conductivity that is less than the first thermal conductivity.

15. The method of claim 13, wherein:
the first dielectric material comprises an oxide material; and
the second dielectric material comprises a nitride material.

16. The method of claim 1, further comprising:
forming a first terminal conductor of the transistor in contact with a first portion of the channel portion;
forming a second terminal conductor of the transistor in contact with a second portion of the channel portion;
forming a gate dielectric in contact with a third portion of the channel portion that is between the first portion and the second portion; and
forming a gate conductor of the transistor over the gate dielectric.

17. A method, comprising:
forming a deck of memory cells;
forming a dielectric portion including one or more dielectric materials over the deck of memory cells;
forming a plurality of cavities within the dielectric portion, wherein each of the plurality of cavities includes a taper from a first cross-sectional area toward a point;
depositing a semiconductor material in each of the plurality of cavities and above the one or more dielectric materials;
forming a plurality of single crystalline arrangements of the semiconductor material, each associated with one of the plurality of cavities, wherein forming the plurality of single crystalline arrangements comprises nucleating each of the plurality of single crystalline arrangements based at least in part on heating and cooling the semiconductor material after depositing the semiconductor material in each of the plurality of cavities; and
forming, from each of the plurality of single crystalline arrangements of the semiconductor material, a respective channel portion of a transistor based at least in part on doping the single crystalline arrangement of the semiconductor material.

18. The method of claim 17, further comprising:
patterning the semiconductor material that is above the one or more dielectric materials and between each of the plurality of cavities to expose a surface of the one or more dielectric materials between each of the plurality of cavities, wherein forming the plurality of single crystalline arrangements of the semiconductor material is based at least in part on the patterning.

19. The method of claim 18, further comprising:
depositing a dielectric material in contact with the patterned semiconductor material and the exposed surface of the one or more dielectric materials, wherein forming the plurality of single crystalline arrangements of the semiconductor material is based at least in part on depositing the dielectric material.

20. The method of claim 17, wherein heating the semiconductor material comprises:
applying a laser to at least the dielectric portion and the semiconductor material.

21. The method of claim 17, wherein forming the plurality of single crystalline arrangements of the semiconductor material comprises:
nucleating each of the single crystalline arrangements of the semiconductor material at a respective nucleation site at an end of a respective cavity opposite from an opening of the respective cavity.

22. The method of claim 17, wherein depositing the semiconductor material further comprises:
depositing the semiconductor material with an amorphous arrangement or a polycrystalline arrangement.

23. The method of claim 17, further comprising:
depositing, in each of the plurality of cavities, a second material before depositing the semiconductor material, wherein forming the plurality of single crystalline arrangements of the semiconductor material is based at least in part on a nucleation of the single crystalline arrangements at respective interfaces between the second material and the semiconductor material.

24. The method of claim 17, further comprising:
forming the one or more dielectric materials based at least in part on depositing a first dielectric material and depositing a second dielectric material over the first dielectric material, wherein forming the plurality of cavities comprises forming each of the plurality of cavities with the respective taper through at least a portion of the first dielectric material.

25. The method of claim 17, further comprising forming, for each transistor of the plurality:
   a first terminal conductor of the transistor in contact with a first portion of the respective channel portion;
   a second terminal conductor of the transistor in contact with a second portion of the respective channel portion;
   a gate dielectric in contact with a third portion of the respective channel portion that is between the first portion and the second portion; and
   a gate conductor of the transistor over the gate dielectric.

26. The method of claim 1, wherein a bottom of the cavity is within the dielectric portion.

27. The method of claim 17, wherein a bottom of each of the plurality of cavities is within the dielectric portion.

* * * * *